US010879289B1

(12) United States Patent
Lin et al.

(10) Patent No.: US 10,879,289 B1
(45) Date of Patent: Dec. 29, 2020

(54) METHOD FOR FORMING A SEMICONDUCTOR DEVICE

(71) Applicant: TAIWAN SEMICONDUCTOR MANUFACTURING CO., LTD., Hsinchu (TW)

(72) Inventors: Chin-Yu Lin, Taichung (TW); Keng-Ying Liao, Tainan (TW); Huai-Jen Tung, Tainan (TW); Po-Zen Chen, Tainan (TW); Su-Yu Yeh, Tainan (TW); Chia-Yun Chen, Taipei (TW); Ta-Cheng Wei, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/511,803

(22) Filed: Jul. 15, 2019

(51) Int. Cl.
| | | |
|---|---|---|
| *H01L 27/00* | (2006.01) | |
| *H01L 21/00* | (2006.01) | |
| *H01L 31/00* | (2006.01) | |
| *H01L 27/146* | (2006.01) | |
| *H01L 21/306* | (2006.01) | |
| *H01L 21/762* | (2006.01) | |
| *H01L 21/768* | (2006.01) | |
| *H01L 31/18* | (2006.01) | |
| *H01L 21/3105* | (2006.01) | |

(52) U.S. Cl.
CPC .... *H01L 27/1463* (2013.01); *H01L 21/30604* (2013.01); *H01L 21/31053* (2013.01); *H01L 21/76224* (2013.01); *H01L 21/76895* (2013.01); *H01L 27/14683* (2013.01); *H01L 31/1804* (2013.01)

(58) Field of Classification Search
CPC ......... H01L 21/31053; H01L 21/76224; H01L 21/76895; H01L 21/30604; H01L 21/02639; H01L 21/0237; H01L 21/02532; H01L 21/78638; H01L 27/1463; H01L 27/14683; H01L 27/1214; H01L 27/1266; H01L 27/14625; H01L 31/1804; H01L 31/035227; H01L 31/0352; H01L 31/103
See application file for complete search history.

(56) References Cited

U.S. PATENT DOCUMENTS

| | | | | |
|---|---|---|---|---|
| 8,735,280 | B1* | 5/2014 | Yeh | H01L 21/76885 438/625 |
| 9,269,730 | B2* | 2/2016 | Barr | H01L 27/14601 |
| 9,686,457 | B2* | 6/2017 | Madurawe | H04N 5/2253 |
| 10,134,634 | B2* | 11/2018 | Li | H01L 21/78 |
| 2016/0126133 | A1* | 5/2016 | Li | H01L 21/76898 438/667 |
| 2017/0078539 | A1* | 3/2017 | Madurawe | H01L 27/14629 |

* cited by examiner

*Primary Examiner* — Nikolay K Yushin
(74) *Attorney, Agent, or Firm* — Maschoff Brennan

(57) ABSTRACT

A method for fabricating a semiconductor device is provided. The method includes forming a metal catalyst layer on an etching area of the semiconductor substrate; performing a wet etch process to the semiconductor substrate to etch the etching area of the semiconductor substrate under the metal catalyst layer, thereby forming a trench in the semiconductor substrate; and removing the metal catalyst layer from the semiconductor substrate after performing the wet etch process.

20 Claims, 22 Drawing Sheets

METHOD FOR FORMING A SEMICONDUCTOR DEVICE

BACKGROUND

Integrated circuits (IC) with image sensors are used in a wide range of modern day electronic devices. In recent years, complementary metal-oxide semiconductor (CMOS) image sensors have begun to see widespread use, largely replacing charge-coupled devices (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
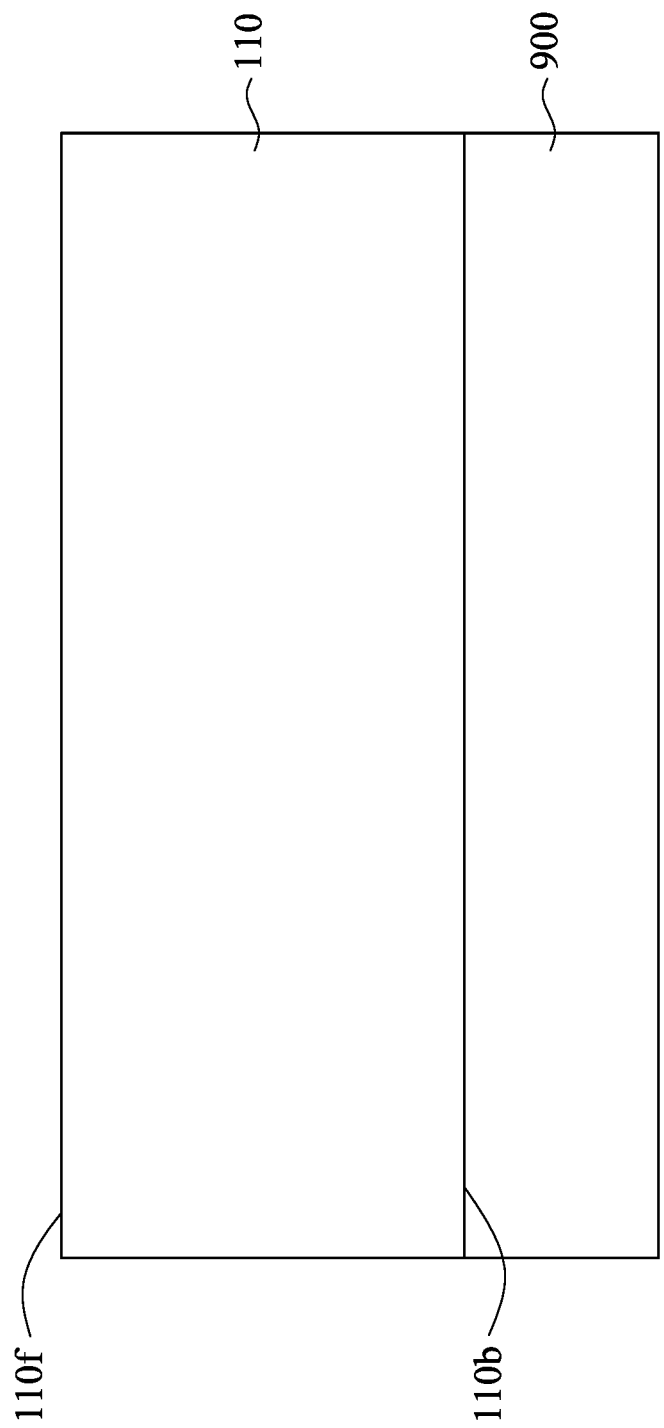
FIGS. 1-11 illustrate a method of fabricating an image sensor according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present embodiments, a method for forming a trench with vertical sidewalls is provided. The trench may have a high aspect ratio. The trench may be filled with dielectric materials, thereby forming an isolation structure, such as a deep trench isolation (DTI) structure or a shallow trench isolation (STI) for an image sensor integrated chip. Although the isotation structure in the present embodiments are illustrated within a BSI image sensor, it will be appreciated that the disclosed isotation structure may also be used with front-side image (FSI) image sensors. Furthermore, the method for forming the trench with vertical sidewalls and a high aspect ratio and forming the isolation structure in the trench may be used in other process, not limited the process of fabricating an image sensor.

FIGS. 1-11 illustrate a method of fabricating an image sensor according to various embodiments of the present disclosure. FIG. 1 illustrates a substrate 110 with its back-side 110*b* bonded to a support substrate 900. The substrate 110 may be any type of semiconductor body (e.g., silicon, SiGe, semiconductor-on-insulator (SOI), etc.), as well as any other type of semiconductor and/or epitaxial layers, associated therewith. For example, in some embodiments, the substrate 110 may include a base substrate and an epitaxial layer. In some embodiments, the substrate 110 may include a silicon substrate. In some embodiments, the substrate 110 may be thinned by etching and/or mechanical grinding a front-side 110*f* of the substrate 110 after bonding to the support substrate 900. Thinning the substrate 110 allows for radiation to pass more easily to a photosensitive region subsequently formed within the substrate 110.

Figure 2:
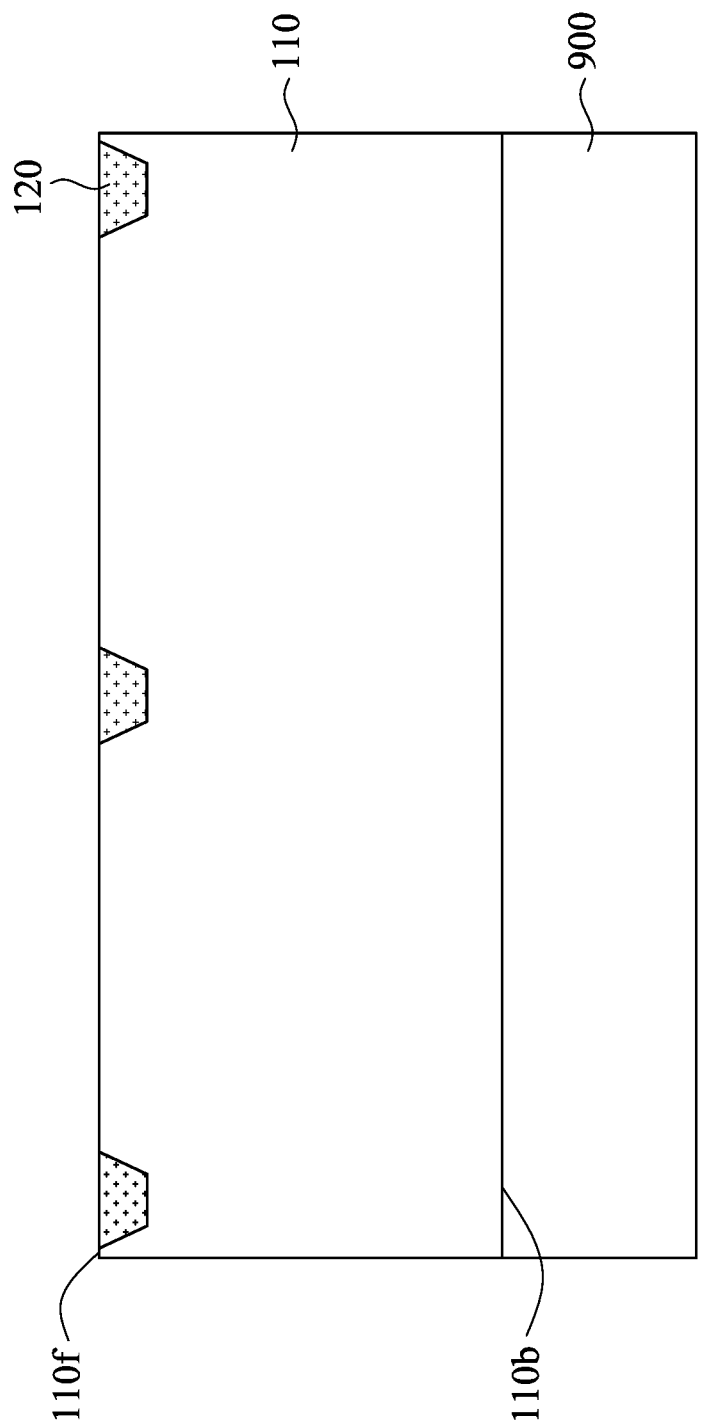

Reference is made to FIG. 2. One or more isolation features 120 may be formed within the front-side 110*f* of the substrate 110. The isolation features 120 include shallow trench isolation (STI) structures and/or local oxidation of silicon (LOCOS) structures. In some embodiments, the isolation features 120 are formed by patterning the front-side 110*f* of the substrate 110 to form trenches in the substrate 110 and filling a dielectric material into the trenches. The dielectric material may include silicon oxide, silicon nitride, silicon oxynitride, a low-k material, or another suitable dielectric material. A chemical mechanical polishing (CMP) process may be performed to planarize the surface of the dielectric material filling the trenches. In some embodiments, dopants in p-type or n-type are implanted into the substrate 110 prior to the formation of the isolation features 120, such that the isolation features 120 may each be surrounded by a doped layer.

Figure 3:
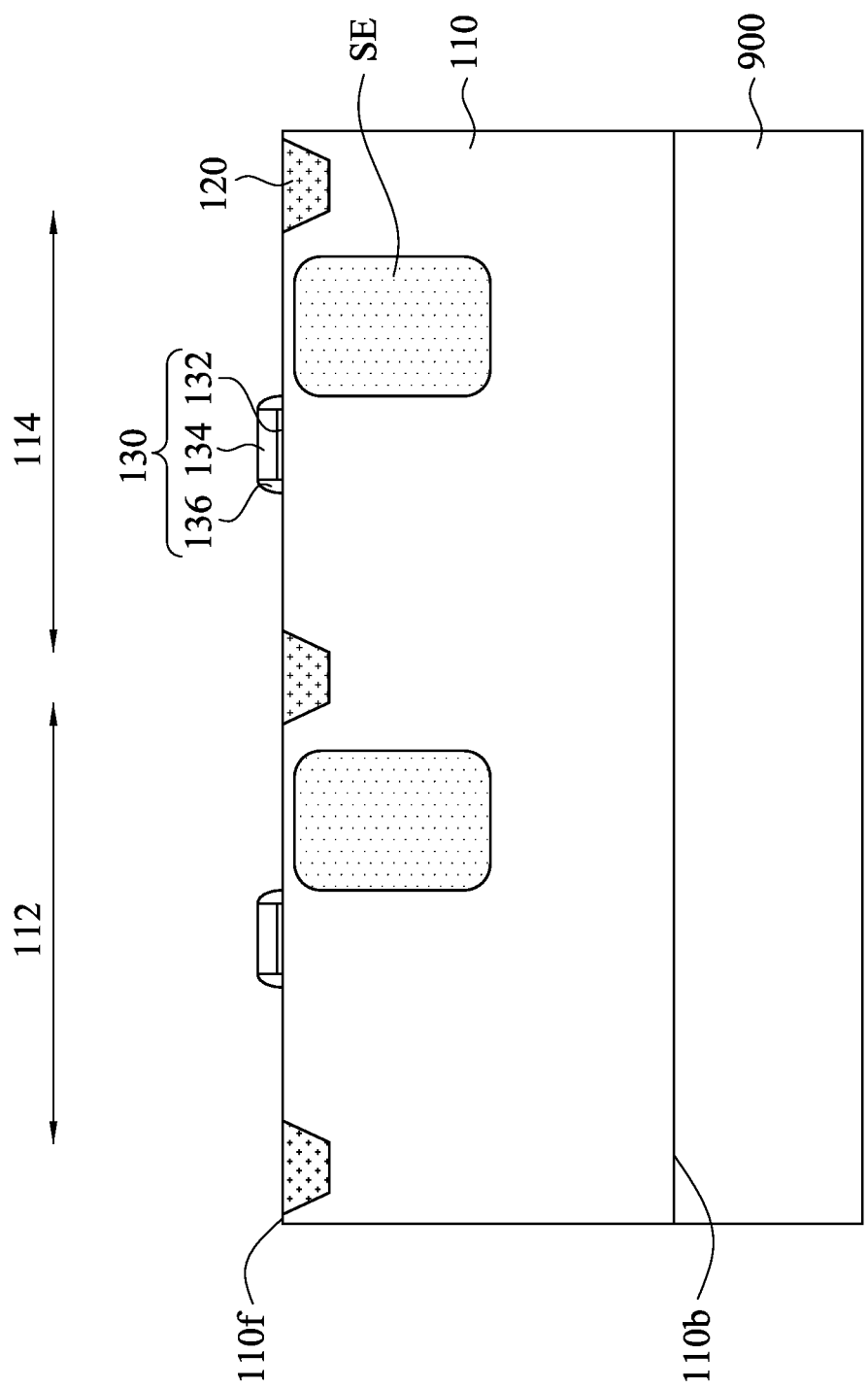

Reference is made to FIG. 3. Plural photosensitive regions SE are formed within pixel regions 112-114 of the substrate 110, respectively, in which each pixel regions 112-114 is between two adjacent isolation features 120. In some embodiments, the photosensitive region SE may include photodiodes formed by implanting or diffusing one or more dopant species into a front-side 110*f* of the substrate 110. For example, the photosensitive regions SE are doped with a doping polarity opposite from that of the substrate 110. The photosensitive regions SE are formed adjacent to or near the front-side 110*f* of the substrate 110. The photosensitive regions SE are operable to sense incident radiation that enters the pixel region from the back-side 110*b*. The incident radiation may be visual light. Alternatively, the incident radiation may be infrared (IR), far infrared (FIR), ultraviolet (UV), X-ray, microwave, other suitable types of radiation, or a combination thereof.

One or more transistor gate structures 130 are formed along the front-side 110*f* of the substrate 110 within the pixel regions 112-114. In various embodiments, the one or more transistor gate structures 130 may correspond to a transfer transistor, a source-follower transistor, a row select transistor, and/or a reset transistor. In some embodiments, the one or more transistor gate structures 130 may be formed by depositing a gate dielectric film and a gate electrode film on the front-side 110f of the substrate 110. The gate dielectric film and the gate electrode film are subsequently patterned to form a gate dielectric layer 132 and a gate electrode 134. Sidewall spacers 136 may be formed on the outer sidewalls of the gate electrode 134. In some embodiments, the sidewall spacers 136 may be formed by depositing a spacer layer (e.g., a nitride, an oxide, etc.) onto the front-side 110f of the substrate 110 and selectively etching the spacer layer to form the sidewall spacers 136. In some embodiments, source/drain regions are formed, by ion implantation or epitaxially growth, on two opposing sides of each of the gate structures 130.

Figure 4:
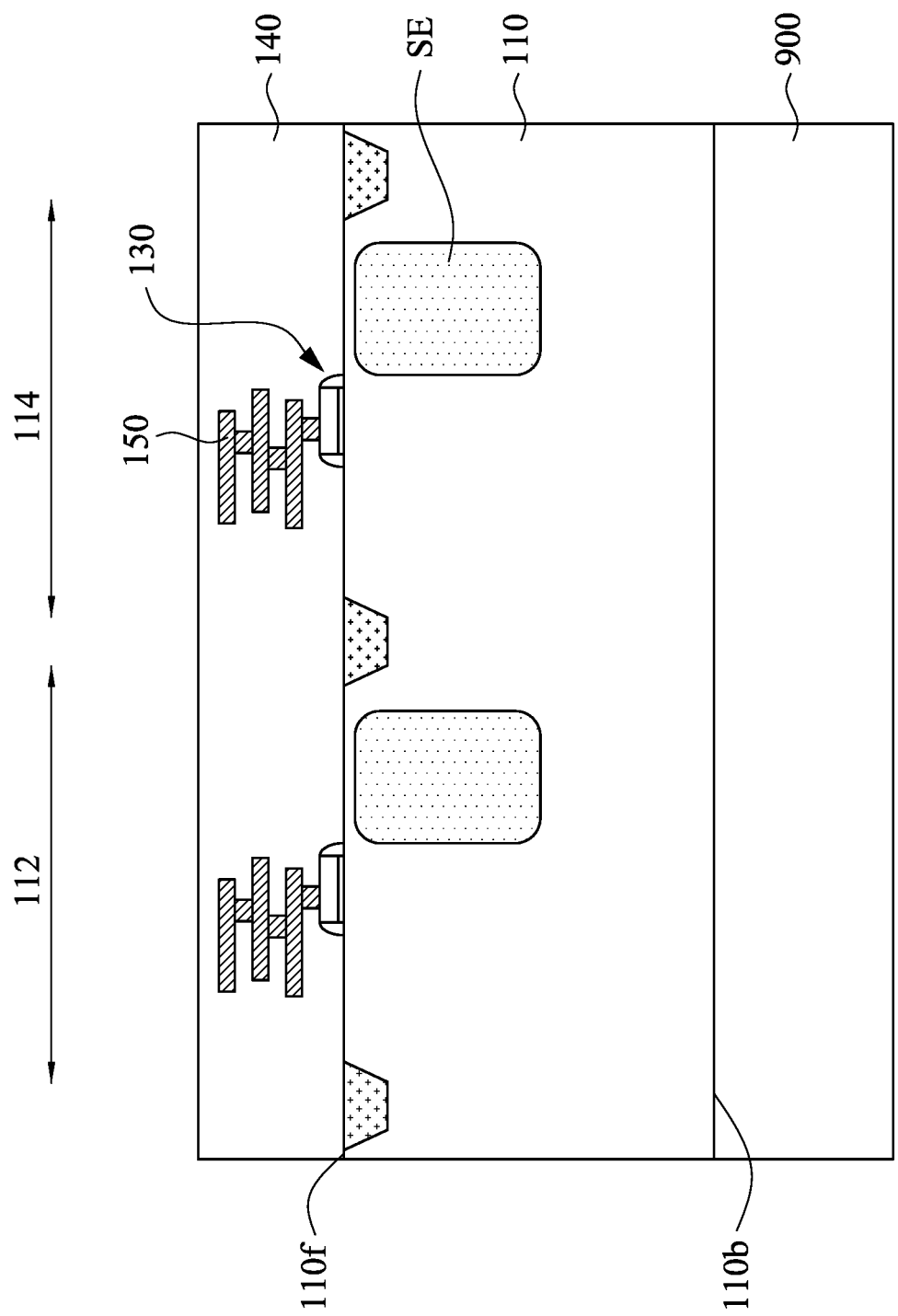

Reference is made to FIG. 4. Plural conductive interconnect layers 150 are formed within a dielectric structure 140 formed along the front-side 110f of the substrate 110. The dielectric structure 140 includes plural stacked ILD layers, while the plural conductive interconnect layers 150 include alternating layers of conductive wires and vias. In some embodiments, one or more of the plural conductive interconnect layers 150 may be formed using a damascene process (e.g., a single damascene process or a dual damascene process). The damascene process is performed by forming an ILD layer over the front-side 110f of the substrate 110, etching the ILD layer to form a via hole and/or a metal trench, and filling the via hole and/or metal trench with a conductive material. In some embodiments, the ILD layer may be deposited by a physical vapor deposition technique (e.g., physical vapor deposition (PVD), chemical vapor deposition (CVD), plasma enhanced CVD (PE-CVD), atomic layer deposition (ALD), etc.) and the conductive material may be formed using a deposition process and/or a plating process (e.g., electroplating, electro-less plating, etc.). In various embodiments, the plural conductive interconnect layers 150 may include tungsten, copper, or aluminum copper, for example.

In some embodiments, the support substrate 900 may be removed from the back-side 110b of the substrate 110 after forming the dielectric structure 140 and the conductive interconnect layers 150 along the front-side 110f of the substrate 110. Subsequently, isolation features 160 (referring to FIGS. 10A and 10B) are to be formed from the back-side 110b of the substrate 110. The isolation features 160 (referring to FIGS. 10A and 10B) may be formed by patterning the back-side 110b of the substrate 110 to form plural trenches and filling the trenches with dielectric materials. In some cases where the trenches are formed by plasma dry etch process, the plasma may destroy the lattice of the substrate and thereby lower the absorbance of the substrate, which will result in poor detection performance of the image sensor subsequently formed. In the present embodiments, FIGS. 5A-9 shows a method for forming the trenches by a wet etch process without using plasma, such that lattice of the substrate would not be damaged by the plasma, and the detection performance of the image sensor may not be impaired.

Figure 5A:
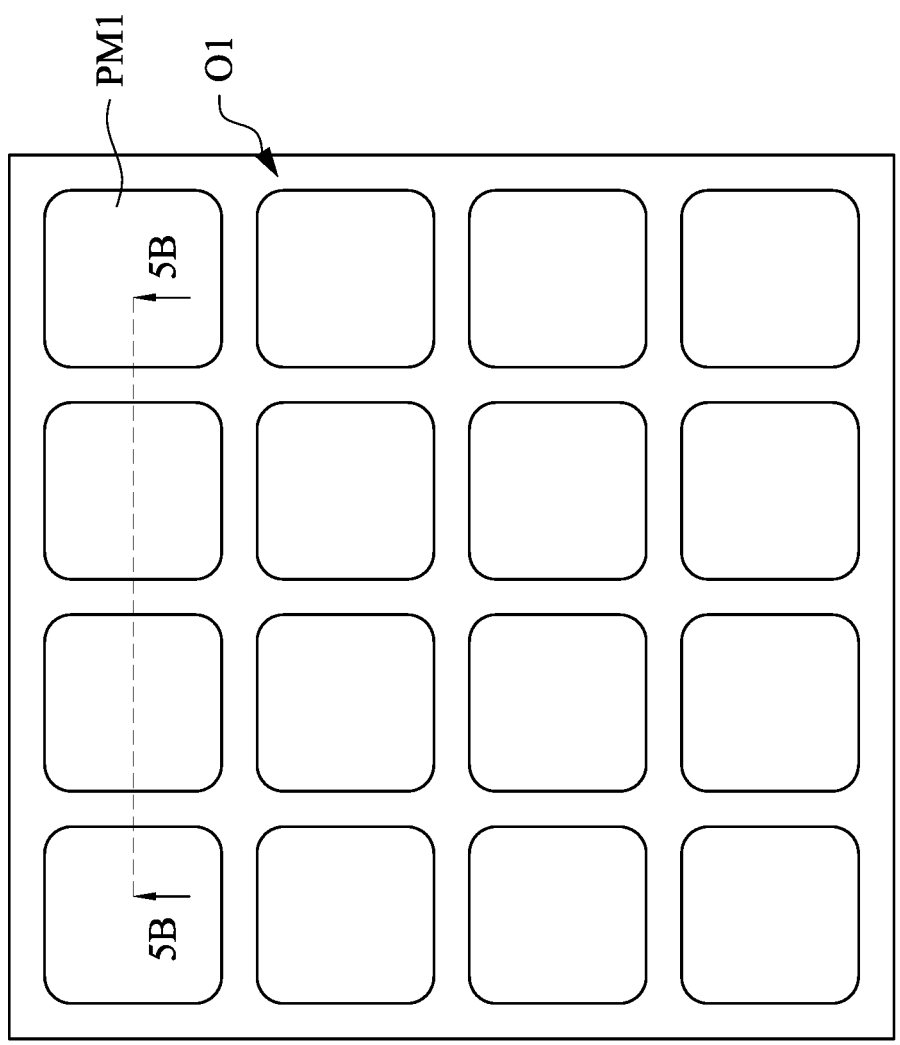
Figure 5B:
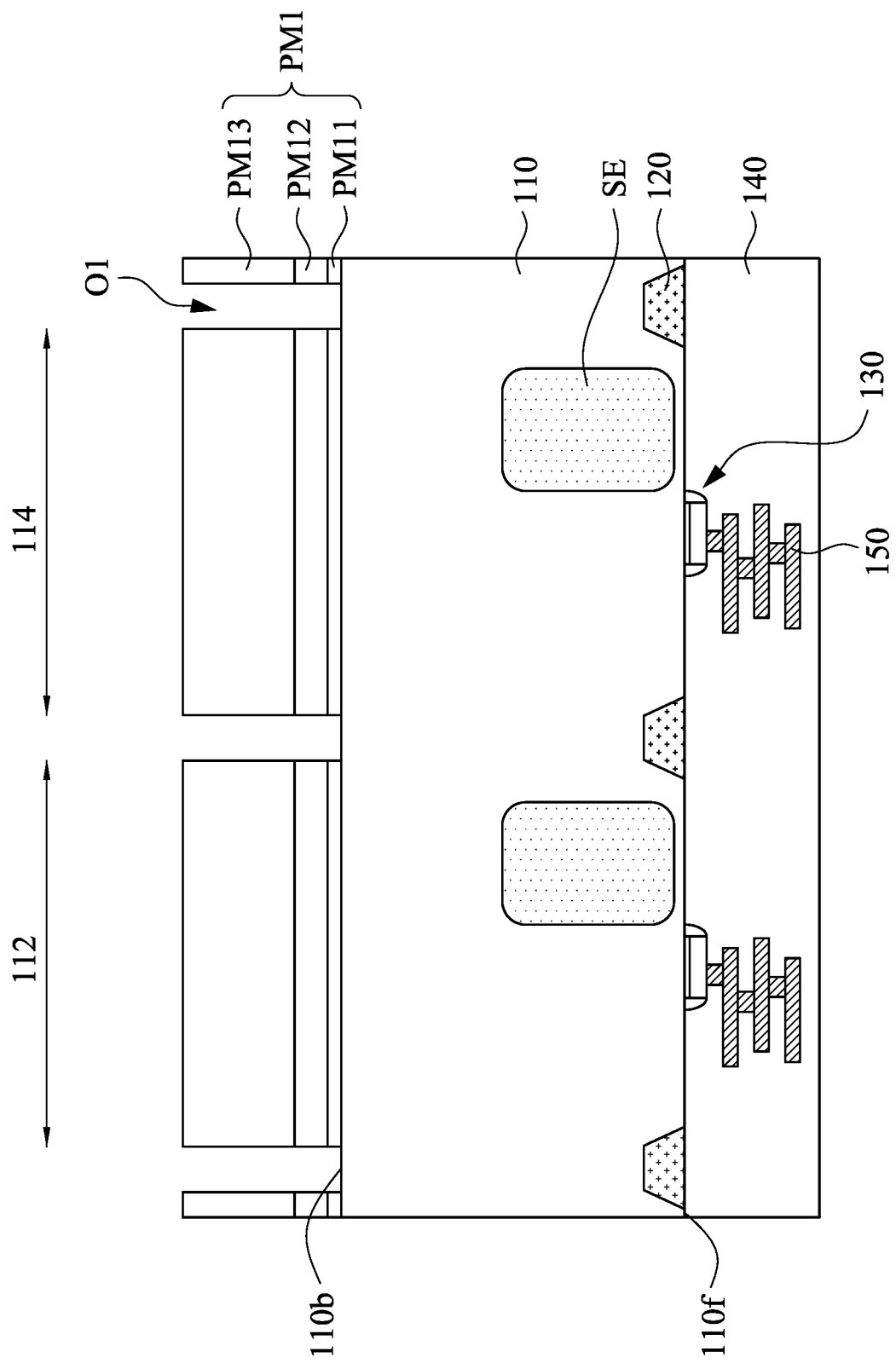

Reference is made to FIGS. 5A and 5B. FIG. 5B is a cross-sectional view taken along line 5B-5B of FIG. 5A. The substrate 110 is first flipped about the horizontal axis, and the support substrate 900 is removed. A patterned mask PM1 is formed along the back-side 110b of the substrate 110. The patterned mask PM1 includes sidewalls defining openings O1 along the back-side 110b of the substrate 110.

The patterned mask PM1 may include a mask layer PM11, an anti-reflective coating (ARC) layer PM12, and a photoresist layer PM13 on the back-side 110b of the substrate 110. The mask layer PM11 may include one or more oxide (e.g., silicon oxide) and/or nitride (e.g., silicon nitride) layers. The mask layer PM11 may be blanket deposited over substrate 110 using any suitable deposition process, such as, atomic layer deposition (ALD), chemical vapor deposition (CVD), high density plasma CVD (HDP-CVD), physical vapor deposition (PVD), thermal oxidation, thermal nitridation, and the like. The mask layer PM11 may also act as an etch stop layer for etching the ARC layer PM12.

The ARC layer PM12 and the photoresist layer PM3 may be blanket deposited over the mask layer 105. The ARC layer PM12 may reduce a reflection from underlying layers during photolithography. In some embodiments, the ARC layer PM12 may be formed using similar materials and methods as those mentioned regarding the mask layer PM11, and the materials and methods of the ARC layer PM12 are not repeated herein. In some embodiments, the mask layer PM11 may be formed of silicon oxide and the ARC layer PM12 may be formed of silicon nitride.

In some embodiments, the photoresist layer PM13 may be patterned to include openings by exposing the photoresist layer PM13 to light (e.g., ultraviolet light) using a reticle. Exposed or unexposed portions of the photoresist layer PM13 may then be removed by development depending on whether a positive or negative resist is used to form the openings in the photoresist layer PM13. The openings in the photoresist layer PM13 may be aligned with an area of substrate 110 disposed between adjacent pixel regions 112-114. The pattern of the photoresist layer PM13 (e.g., the openings) is then transferred to the ARC layer PM12 and the mask layer PM11 using a suitable etching process. To specific, the photoresist layer PM13 is used as an etch mask to etch the underlying ARC layer PM12 and the mask layer PM11. Accordingly, openings are formed in the ARC layer PM12 and the mask layer PM11, such that the patterned mask PM1 has the openings O1 to expose areas of the back-side 110b of the substrate 110 that is to be etched in subsequent process. The exposed areas of the back-side 110b of the substrate 110 may also be referred to as etching areas in this context. In some embodiments, each pixel regions 112 and 114 is between adjacent etching areas exposed by the patterned mask PM1.

In some alternative embodiments, the patterned mask PM1 may be formed by depositing a layer of photosensitive material (e.g., a positive or negative photoresist) along the back-side 110b of the substrate 110. The layer of photosensitive material is selectively exposed to electromagnetic radiation according to a photomask. The electromagnetic radiation modifies a solubility of exposed regions within the photosensitive material to define soluble regions. The photosensitive material is subsequently developed to define the openings O1 within the photosensitive material by removing the soluble regions.

Figure 6:
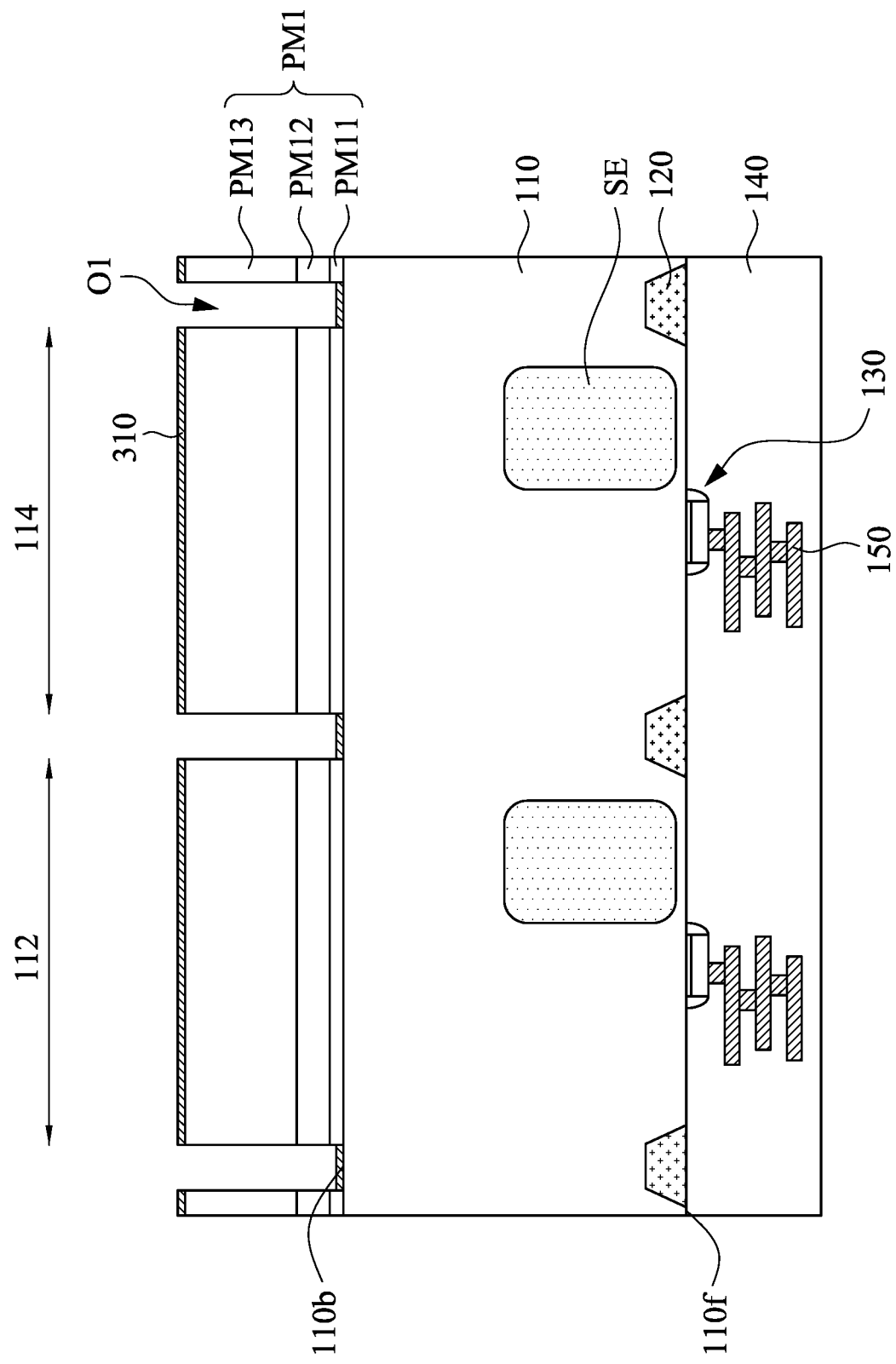

Reference is made to FIG. 6. A metal catalyst layer 310 is blanketly deposited over the patterned mask PM1 and the exposed areas of the substrate 110. The metal catalyst layer 310 may include one or more metal having a catalytic effect for etching the substrate 110, which will be illustrated later. For example, the metal catalyst layer 310 may include group-B metals, such as gold (Au), silver (Ag), copper (Cu), platinum (Pt), iron (Fe), manganese (Mn), cobalt (Co), or other metal elements capable of being a mediator of the redox reaction (described below). The metal catalyst layer 310 may be deposited by, atomic layer deposition (ALD), chemical vapor deposition (CVD), high density plasma CVD (HDP-CVD), physical vapor deposition (PVD), sputtering, and the like. The metal catalyst layer 310 may be a composite structure having two or more metal layers made of different materials. For example, the metal catalyst layer 310 has a first metal layer and a second metal layer overlaying the first metal layer, in which the first and second metal layer are different and made of aforementioned group-B metals. In some embodiments, the first metal layer is Ag, and the second metal layer is Pt or Au. In some other embodiments, the first metal layer is Au, and the second metal layer is Pt or Ag.

In some embodiments, a thickness of the metal catalyst layer 310 may range from about 1 nanometer to about 500 nanometers, for example, from about 10 nanometers to about 50 nanometers. Through the configuration, the metal catalyst layer 310 may serve as a catalyst for etching the substrate 110, and the metal catalyst layer 310 is uniform enough to provide desired etched profile in subsequent process. If the thickness of the metal catalyst layer 310 is greater than about 500 nanometers, the metal catalyst layer 310 may peel off. If the thickness of the metal catalyst layer 310 is less than about 1 nanometer, the metal catalyst layer 310 may be uneven, which will result in uneven etched profile in subsequent process.

Figure 7A:
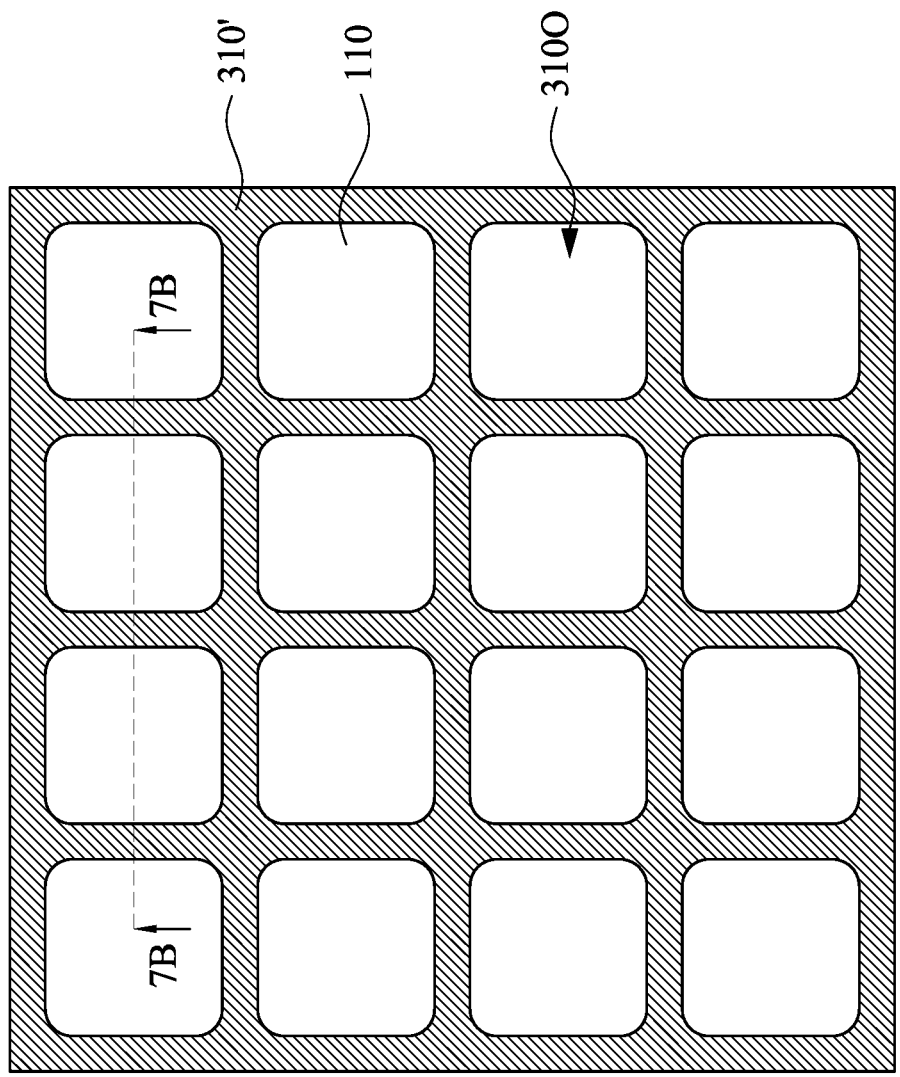
Figure 7B:
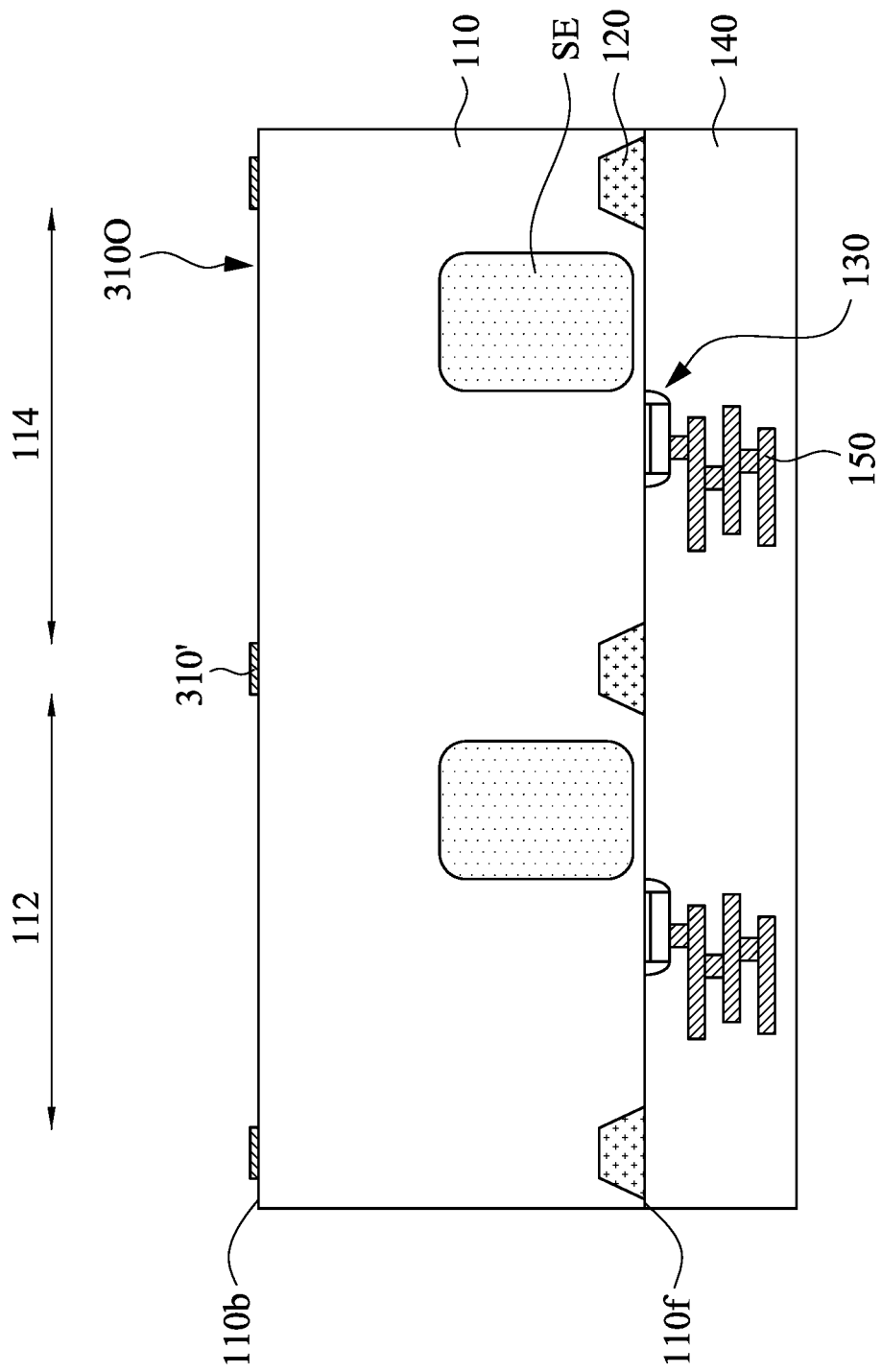

Reference is made to FIGS. 7A and 7B. FIG. 7B is a cross-sectional view taken along line 7B-7B of FIG. 7A. The patterned mask PM1 (referring to FIG. 6) is removed from the substrate 110, and a portion of the metal catalyst layer 310 over the patterned mask PM1 (referring to FIG. 6) is also removed from the substrate. The removal may include a stripped off process. An amount of each of the patterned portions of the photoresist layer is removed by a wet etch process. For example, a strip solvent may be applied by immersion or spray onto the substrate 110 to remove the patterned mask PM1 from the substrate 110. The strip solvent may be may include propylene glycol methyl ether (PGME), propylene glycol methyl ether acetate (PGMEA), the like, and the combination thereof. After stripping the patterned mask PM1, another portion of the metal catalyst layer 310 remains on the back-side 110b of the substrate 110 and is referred to as a metal catalyst layer 310' hereinafter. As shown in the figure, the metal catalyst layer 310' may have plural openings 3100 to expose the back-side 110b of the semiconductor substrate 110.

Figure 8:
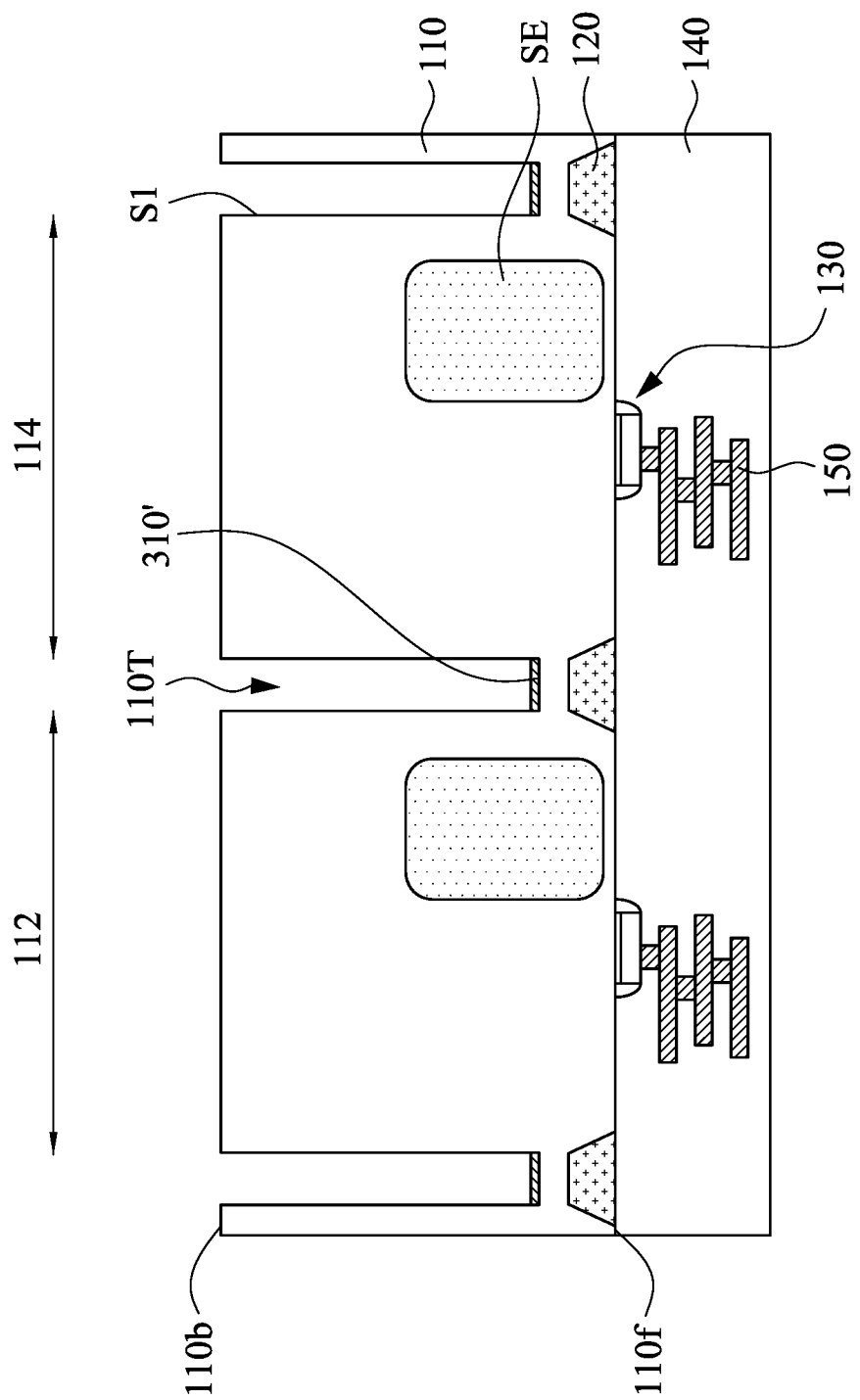

Reference is made to FIG. 8. A wet etching process is performed to the substrate 110 to etch a portion of the substrate 110 under the metal catalyst layer 310', such that trenches 110T are formed on the back-side 110b of the substrate 110. The wet etching process is performed by exposing the back-side 110b of the substrate 110 to one or more etchants with the metal catalyst layer 310' in place. For example, the substrate 110 is immersed in an etching solution containing the one or more etchants, such that the etching solution reaches the metal catalyst layer 310' and a portion of the semiconductor substrate not covered by the metal catalyst layer 310'. The one or more etchants react with the metal catalyst layer 310' and remove parts of the substrate 110 below the metal catalyst layer 310'. The etchants do not react with the portion of the semiconductor substrate not covered by the metal catalyst layer 310'. Therefore, the wet etching process forms plural trenches 110T, which will subsequently accommodate DTI structures. The trenches 110T has vertical sidewalls S1, which may have a right angle with respect to the back-side 110b of the substrate. For example, an angle between the vertical sidewalls S1 and the back-side 110b can be in a range of about 80 degrees to about 100 degrees, for example, about 90 degrees.

In some cases, BOSCH process, which includes cycle steps of deposition, clean, and etch, can be used to form trenches. However, the trenches formed by the BOSCH process may have balling profile, striation shapes, and scallop sidewalls, which would result in defect in subsequently deposition process. In some embodiments, compared with trenches formed by BOSCH process the wet etch process may form the trenches 110T with flat vertical sidewalls S1, such that subsequently deposition process may have less defect. Through the configuration, the DTI structures subsequently formed in the trenches 110T will have vertical sidewalls, which in turn will enlarge areas of the pixel regions of the image sensor.

In some embodiments where the semiconductor substrate 110 is silicon, the etching solution can be an aqueous solution of hydrofluoric acid (e.g., hydrogen fluoride (HF)) and an oxidative agent like hydrogen peroxide ($H_2O_2$) or $HNO_3$. Hole injection takes place during the wet etch process such that the etching solution can be infiltrated to the surface of the silicon substrate 110. The oxidative agent like $H_2O_2$ or $HNO_3$ is utilized to oxidize the silicon to form silicon dioxide underneath the silver, and then the hydrofluoric acid is utilized to etch the silicon dioxide, thereby etching down. Through the configuration, the silicon substrate 110 is partially etched down through a redox reaction with the catalyst of the metal catalyst layer 310' (e.g., silver) at the area on which the silver is located, and the area uncovered by the metal catalyst layer 310' (e.g., silver) is not etched down.

To be specific, the oxidative agent (e.g., $H_2O_2$ or $HNO_3$), in the etching solution oxidizes the surface of the substrate 110 which contacts the metal catalyst layer 310' (i.e., the surface of the substrate 110 under the metal catalyst layer 310') to form silicon oxide by the metal catalyst layer 310'. And then, HF in the etching solution etches the silicon oxide on the substrate 110. When the silicon oxide is completely etched, the metal catalyst layer 310' follows down to contact the newly exposed surface of the substrate 110 and foregoing reactions (or steps) are repeated to etch the newly exposed surface of the substrate 110. The surface of the substrate 110 contacting the bottom of the metal catalyst layer 310' is etched continuously by repeating foregoing reactions (or steps) because only the bottom of the metal catalyst layer 310' contacts the surface of the substrate 110. Therefore, a vertical etching is created on substrate 110, such that the trenches 110T are formed.

In some embodiments, the redox reaction may be expressed as $M^{x+}+xe^- \rightarrow M$ at cathode, and $Si+6F^- \rightarrow SiF_6^{2-}+x4e^-$ at anode, in which x is an positive integer, and M is the metal element of the metal catalyst layer 310', such that the overall redox reaction may be expressed as $4M^{x+}+xSi+6xF^- \rightarrow 4M+xSiF_6^{2-}$. The metal ions $M^{x+}$ is provided by a reaction between the metal element of the metal catalyst layer 310' and the etching solution (e.g., the solution including HF and $HNO_3/H_2O_2$). Through the configuration, the Si substrate 110 is etched while the metal catalyst layer 310' remains substantially intact. For example, the metal catalyst layer 310' may have substantially the same thickness before and after the wet etch process.

In some embodiments, HF in the etching solution is designed to have a concentration ranging from about 2.0 M to about 7.7 M, for example, ranging from about 3.4 M to about 5.8 M. If the concentration of HF in the etching solution is less than 2.0 M, the redox reaction may not happen. If the concentration of HF in the etching solution is greater than 7.7 M, the metal catalyst layer 310 may be partially etched or peel off, which may result in undesired profile (e.g., uneven bottom surface) of the trench 110T. In some other embodiments, the etching solution may not include HF, but includes other suitable etchants (e.g., acids) for etching the silicon oxide on the substrate 110.

In some embodiments where the oxidative agent is $H_2O_2$, $H_2O_2$ in the etching solution is designed to have a concentration ranging from about 0.2 M to about 3.4 M, for example, ranging from about 0.4 M to about 1.2 M. If the concentration of $H_2O_2$ in the etching solution is less than 0.2 M, the rate to etch the silicon under the metal catalyst layer 310 may be too slow, which may unnecessarily lengthen throughput times of products. If the concentration of $H_2O_2$ in the etching solution is greater than 3.4 M, pores may be formed on sidewalls of the trench 110T, which will result in undesired profile (e.g., uneven sidewalls) of the trench 110T.

Depending on the requirements of DTI structures of image sensor devices, the substrate 110 may be immersed in the etching solution for an immerse time of about 1 minute to about 4 hours, for example, about 5 minutes to about 20 minutes. If the immerse time is less than 1 minute, the depth of the trench may not be enough. If the immerse time is greater than 4 hours, the substrate 110 may be etch through, and the device may be damaged. The trenches 110T may have a high aspect ratio greater than about 10, for example, ranging from about 10 to about 250. In some further embodiments, the aspect ratio of the trenches 110T may greater than about 200 or 300. Through the configuration, the DTI structures in the substrate get deeper and is applicable to image sensors detecting long wavelength light (e.g. infrared light or far infrared light) or multi-wavelength light.

Figure 9:
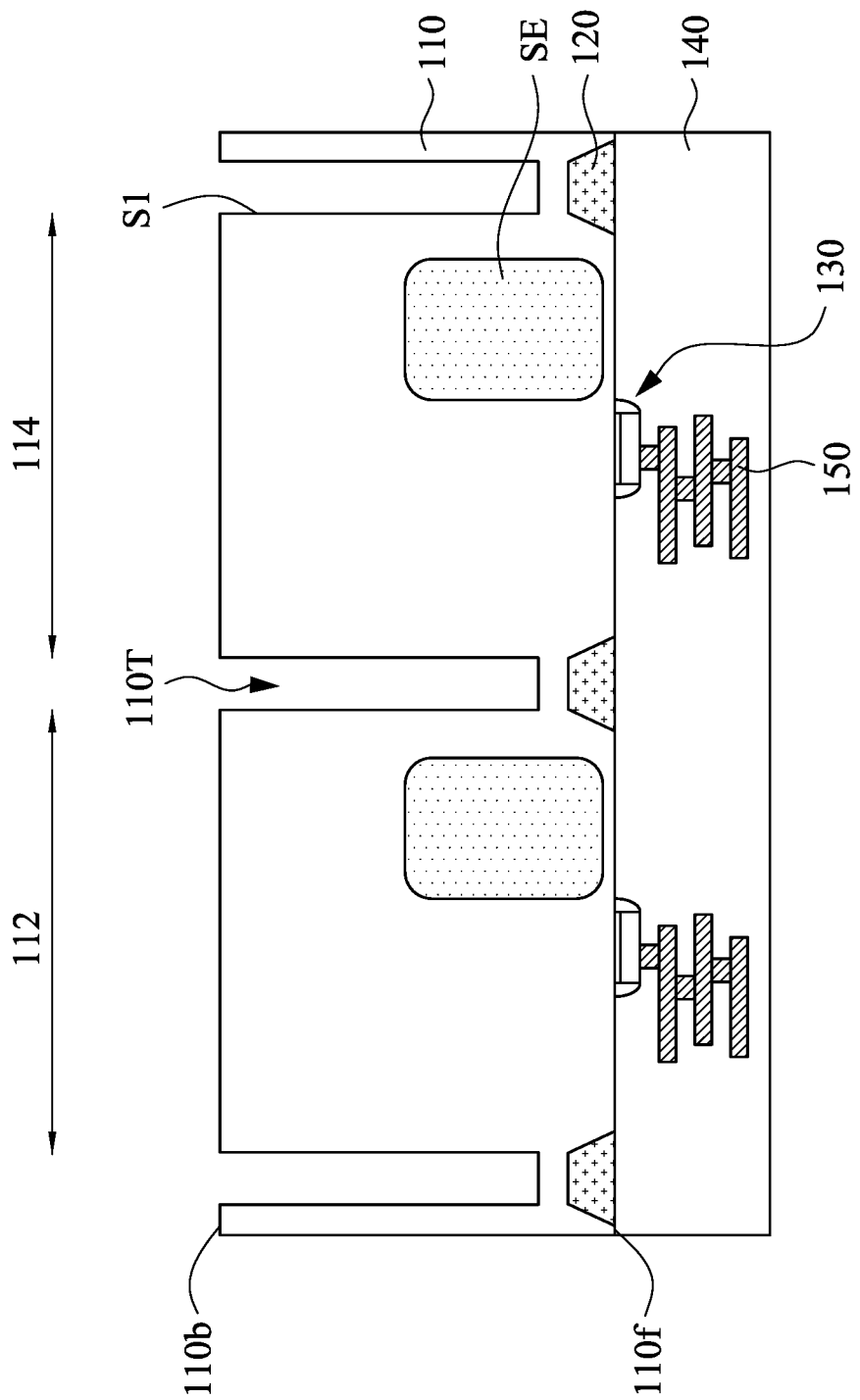

Reference is made to FIG. 9. The metal catalyst layer 310' is removed from the trenches 110T. For example, the metal catalyst layer 310' may be rinsed and washed away from the silicon substrate 110 by using a suitable solution, which removes the metal catalyst layer 310' while remaining the substrate 110 intact. For example, the metal-rinsing solution may etch the metal catalyst layer 310', in which the metal-rinsing solution is selected such that the metal-rinsing solution has a higher etch rate to the metal catalyst layer 310' than that to the substrate 110. For example, in some embodiments where the substrate 110 is silicon, the metal-rinsing solution used herein may be aqua regia, which is a mixture of nitric acid and hydrochloric acid in a molar ratio of 1:3. In some embodiments, the substrate 110 may be immersed in the metal-rinsing solution for about 0.1 minutes to about 10 minutes. If the substrate 110 is immersed in the metal-rinsing solution for less than 0.1 minutes, residues of the metal catalyst layer 310' may remain on the substrate 110. If the substrate 110 is immersed in the metal-rinsing solution for more than 10 minutes, the device may be damaged. In some other embodiments, the metal-rinsing solution may nitric acid.

Figure 10A:
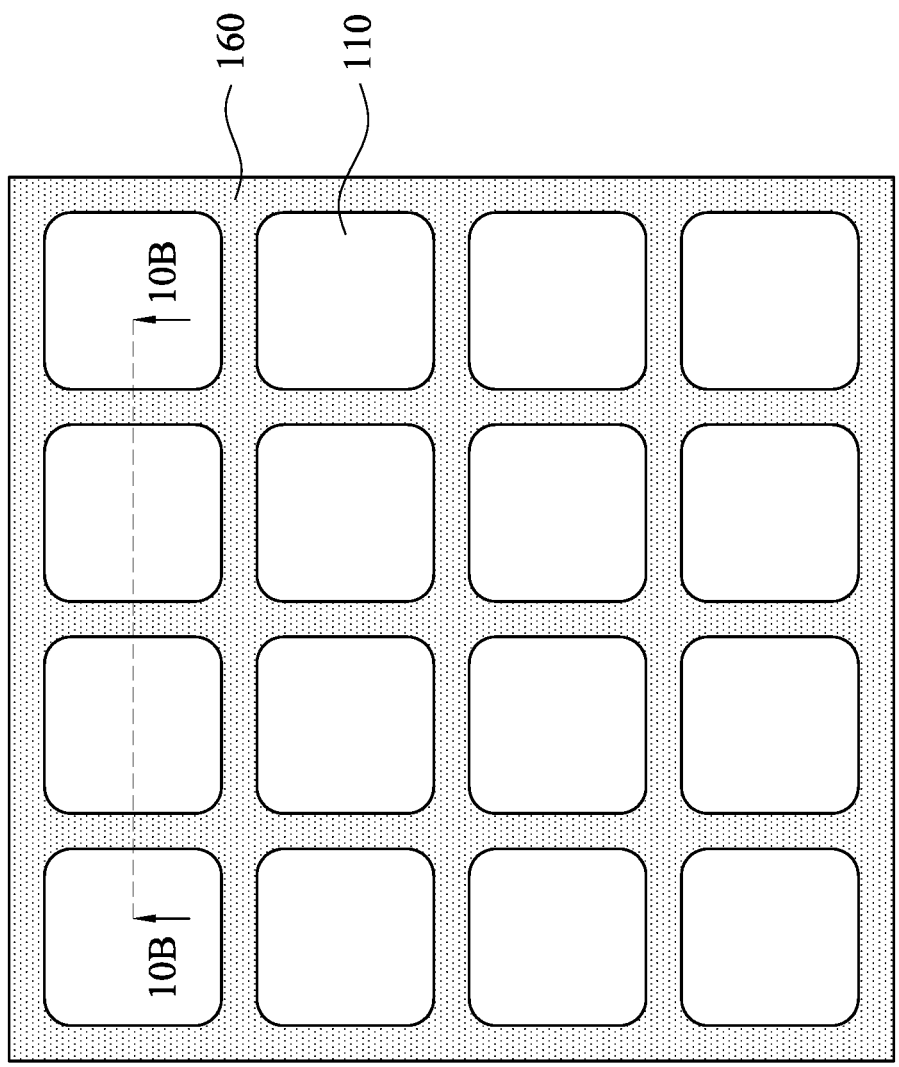
Figure 10B:
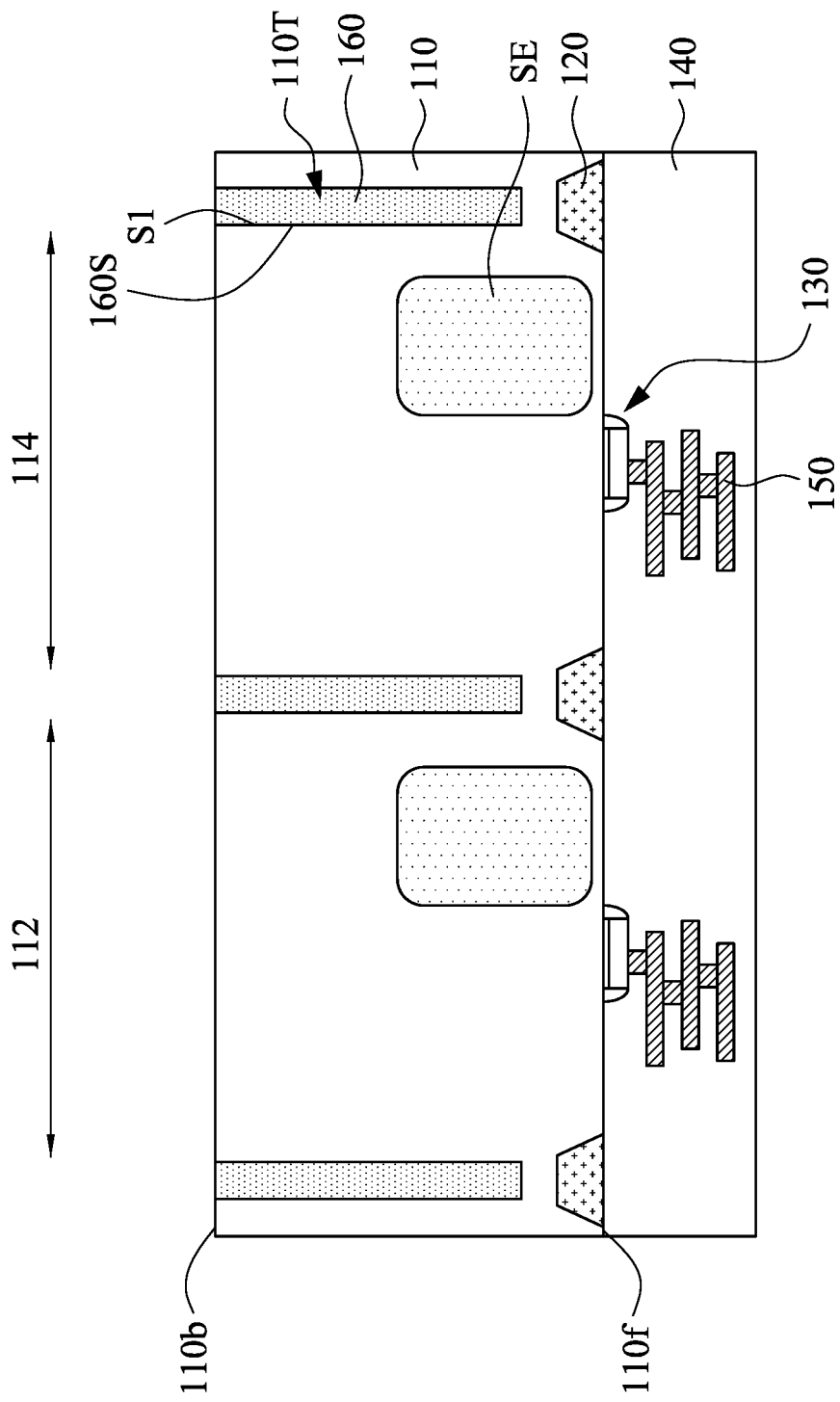

Reference is made to FIGS. 10A and 10B. FIG. 10B is a cross-sectional view taken along line 10B-10B of FIG. 10A. Isolation features 160 are formed in the trenches 110T. In some embodiments, the isolation features 160 may be referred to as DTI structures. In various embodiments, the isolation features 160 may include an oxide, such as silicon oxide, TEOS, etc. For example, the trenches 110T is overfilled with a dielectric material, and then a planarization process such as CMP is performed to remove a portion of the dielectric material out of the trenches 110T. Any suitable deposition technique, such as chemical vapor deposition (CVD), can be used to form the dielectric material. The isolation features 160 may have vertical sidewalls 160S correspond to the vertical sidewalls S1 of the trenches 110T. For example, an angle between the vertical sidewalls 160S and the back-side 110b can be in a range of about 80 degrees to about 100 degrees, for example, in a range of about 89 degrees to about 91 degrees.

In some embodiments, the isolation features 160 may each be surrounded by a doped layer. Prior to the formation of the isolation features 160, a doped layer may be formed conformally over the trenches 110T. The doped layer is lined inside the trenches 110T following a contour of trenches 110T and over the substrate 110. In some embodiments, the doped layer is formed by an ion implantation process that implants dopant in p-type or n-type into the substrate 110. In various embodiments, the doped layer is formed by a multi-process implantation or different implantation process to form suitable doping profiles within doped layer. In some other embodiments, the doped layer may be omitted.

Figure 11:
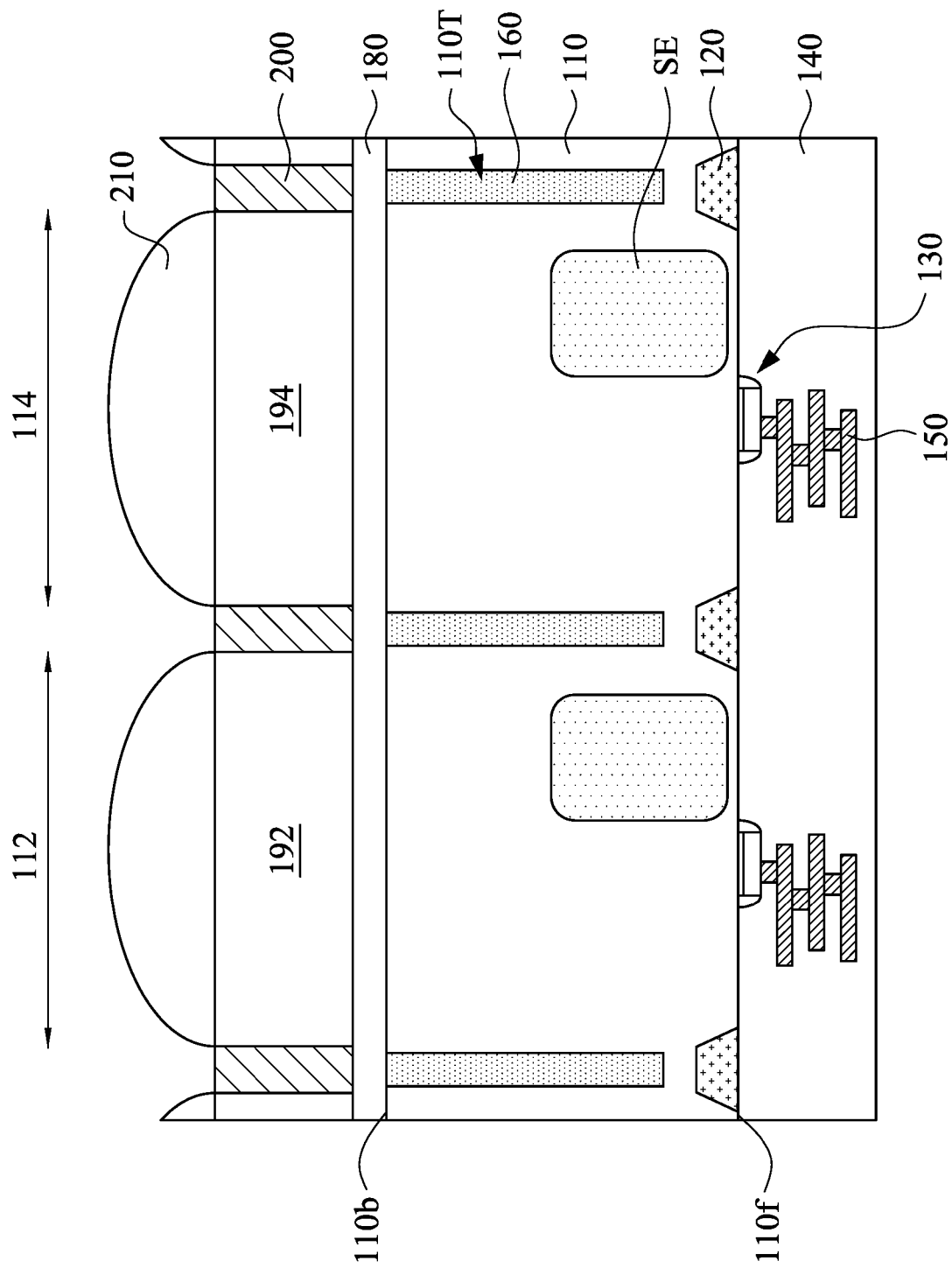

Reference is made to FIG. 11. A dielectric planarization structure 180 is formed over the isolation features 160 and the substrate 110, and then plural color filters 192-194 are formed over the dielectric planarization structure 180. In some embodiments, the color filters 192-194 may be formed within openings in a grid structure 200 overlying the dielectric planarization structure 180. In some embodiments, plural color filters 192-194 may be formed by forming a color filter layer and patterning the color filter layer. The color filter layer is formed of a material that allows for the transmission of radiation (e.g., light) having a specific range of wavelength, while blocking light of wavelengths outside of the specified range. Plural micro-lenses 210 are formed over the color filters 192-194 for collecting photons into pixels. The grid structure 200 may be positioned between adjacent color filters to prevent cross contamination of photons in adjacent pixels. The impinging photons are therefore entering the image sensing device through the back-side 110b. At the presence of high aspect ratio DTI features 160, the photons entering one of the photosensitive regions SE are barred from travelling to the adjacent photosensitive regions SE, and thus cross contamination of the incoming signal can be reduced.

Although the method illustrated in FIG. 5A-9 is used for forming the trenches accommodating DTI structures, it should not limit the scope of the present disclosure. In some embodiments, the method may also be applicable to form a trench accommodating STI structures, which is illustrated in FIGS. 12-18 below.

Figure 12:
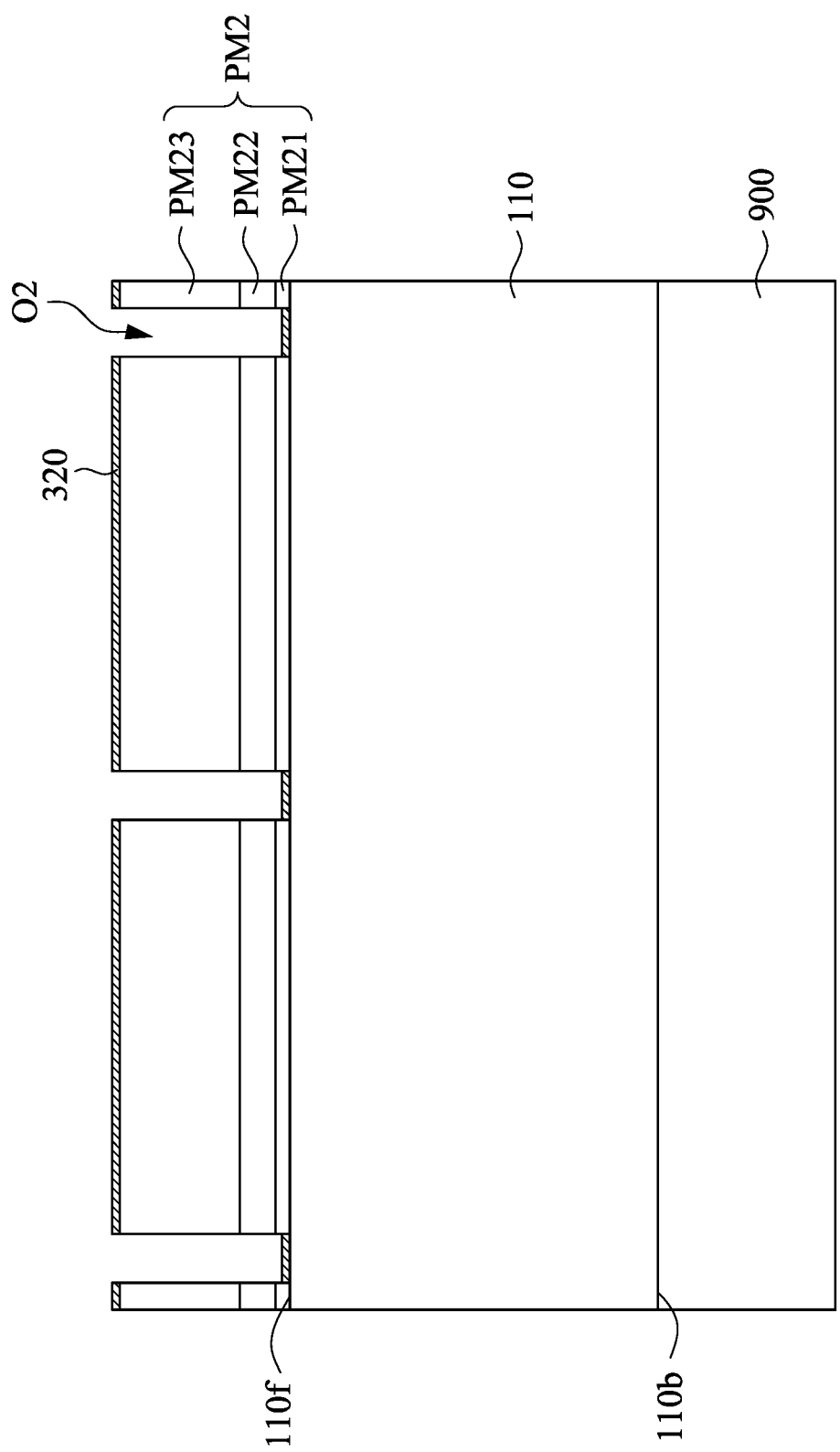
FIGS. 12-18 are cross-sectional views of an image sensor at various intermediate stages of fabricating the image sensor according to various embodiments of the present disclosure.

FIGS. 12-18 are cross-sectional views of an image sensor at various intermediate stages of fabricating the image sensor. Referring to FIG. 12, a patterned mask PM2 is formed along the front-side 110f of the substrate 110. The patterned mask PM2 includes sidewalls defining openings O2 along the front-side 110f of the substrate 110, in which the openings O2 expose areas of the front-side 110f of the substrate 110 that is to be etched in subsequent process. The exposed areas of the front-side 110f of the substrate 110 may also be referred to as etching areas in this context. In some embodiments, the etching areas exposed by the patterned mask PM2 are not overlapping with the photosensitive regions subsequently formed. The patterned mask PM2 may include a mask layer PM21, an anti-reflective coating (ARC) layer PM22, and a photoresist layer PM23 on the front-side 110f of the substrate 110. The detail configuration of the patterned mask PM2 may be similar to the patterned mask PM1 in FIG. 5B, and not repeated herein.

A metal catalyst layer 320 is blanketly deposited over the patterned mask PM2 and the exposed areas of the substrate 110. The metal catalyst layer 320 may include one or more metal having a catalytic effect for etching the substrate 110. For example, the metal catalyst layer 320 may include group-B metals, such as gold (Au), silver (Ag), copper (Cu), platinum (Pt), iron (Fe), manganese (Mn), cobalt (Co), or other metal elements capable of being a mediator of the redox reaction. The detail configuration of the metal catalyst layer 320 may be similar to the metal catalyst layer 310 in FIG. 6, and not repeated herein.

Figure 13:
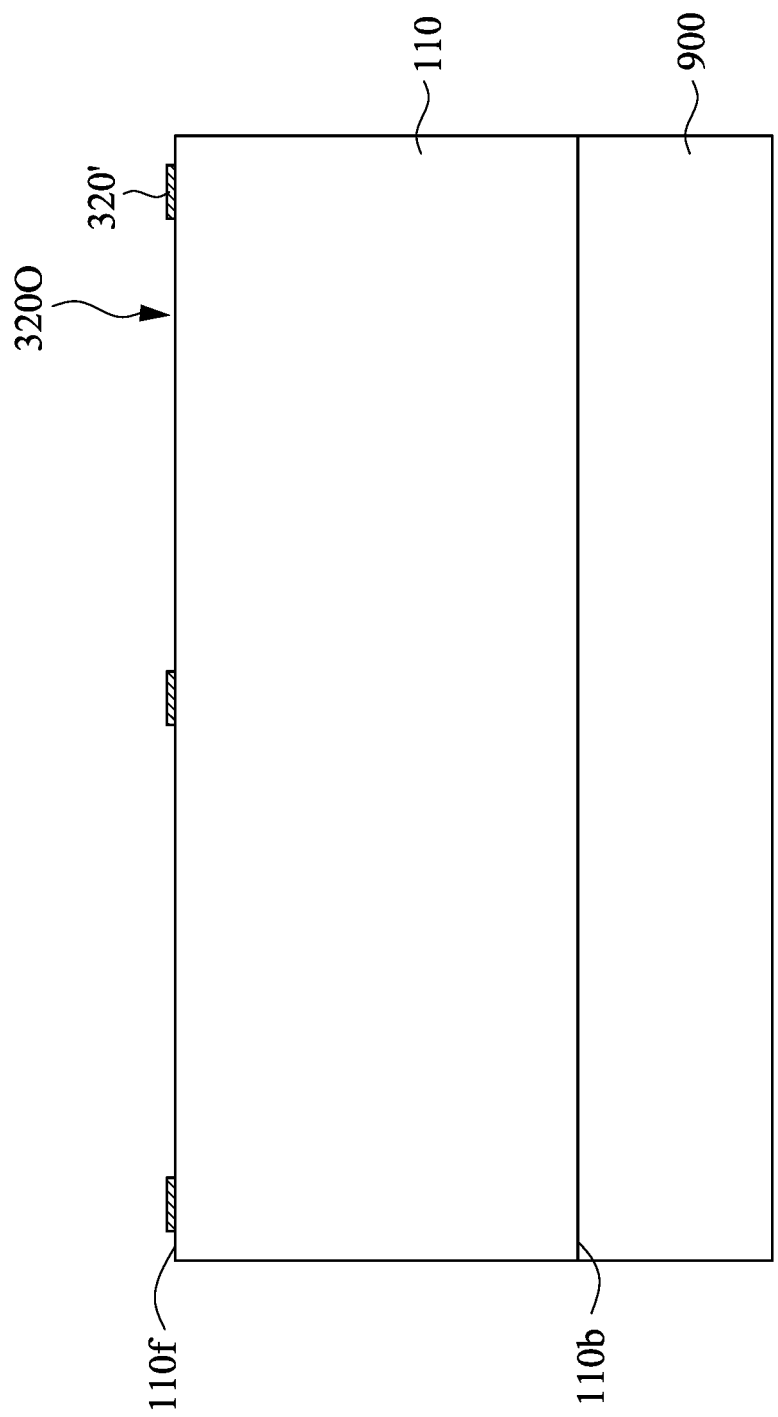

Reference is made to FIG. 13. The patterned mask PM2 (referring to FIG. 13) is removed from the substrate 110, and a portion of the metal catalyst layer 320 over the patterned mask PM2 (referring to FIG. 13) is also removed from the substrate. The removal may include a stripped off process. After stripping the patterned mask PM2, another portion of the metal catalyst layer 320 remains on the front-side 110f of the substrate 110 and is referred to as a metal catalyst layer 320' hereinafter. As shown in the figure, the metal catalyst layer 320' may have plural openings 320O to expose the front-side 110f of the semiconductor substrate 110. Other details of the removing the patterned mask PM2 may be similar to those illustrated with FIGS. 7A and 7B, and not repeated herein.

Figure 14:
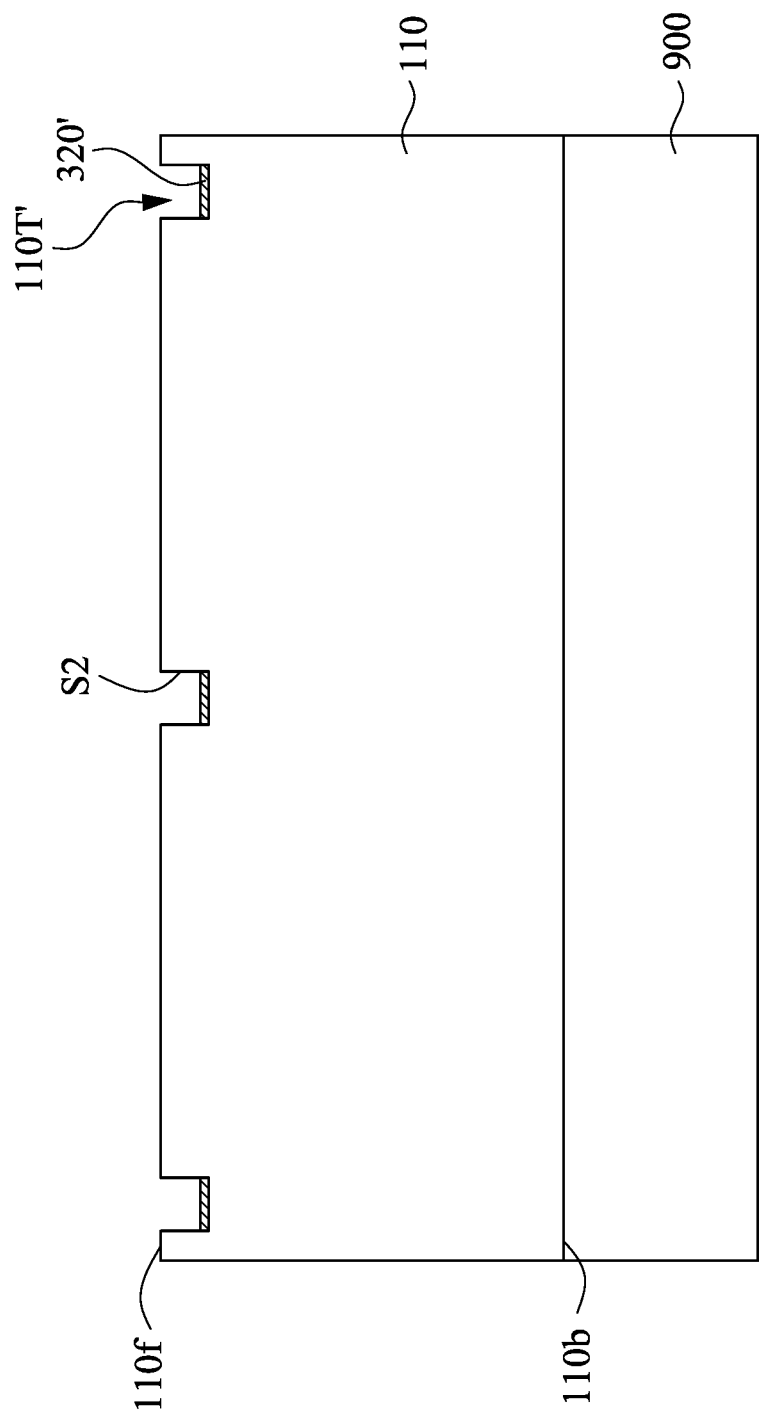

Reference is made to FIG. 14. A wet etching process is performed to the substrate 110 to etch a portion of the substrate 110 under the metal catalyst layer 320', such that trenches 110T' are formed on the front-side 110f of the substrate 110. The wet etching process is performed by exposing the front-side 110f of the substrate 110 to one or more etchants with the metal catalyst layer 320' in place. For example, the substrate 110 is immersed in an etching solution containing the one or more etchants. The one or more etchants react with the metal catalyst layer 320' and remove parts of the substrate 110 below the metal catalyst layer 320', thereby forming plural trenches 110T', which will subsequently accommodate STI structures. For example, the etching solution can be an aqueous solution of hydrogen fluoride (HF) and an oxidative agent like hydrogen peroxide ($H_2O_2$) or $HNO_3$. The trenches 110T' may have vertical sidewalls S2, which have a right angle with respect to the front-side 110f of the substrate. For example, an angle between the vertical sidewalls S2 and the front-side 110f can be in a range of about 80 degrees to about 100 degrees, for example, in a range of about 89 degrees to about 91 degrees. Through the configuration, the STI structure will have vertical sidewalls, which in turn will enlarge areas of the pixel regions of the image sensor. The detail configuration of the wet etching process may be similar to those illustrated with FIG. 8, and not repeated herein.

Figure 15:
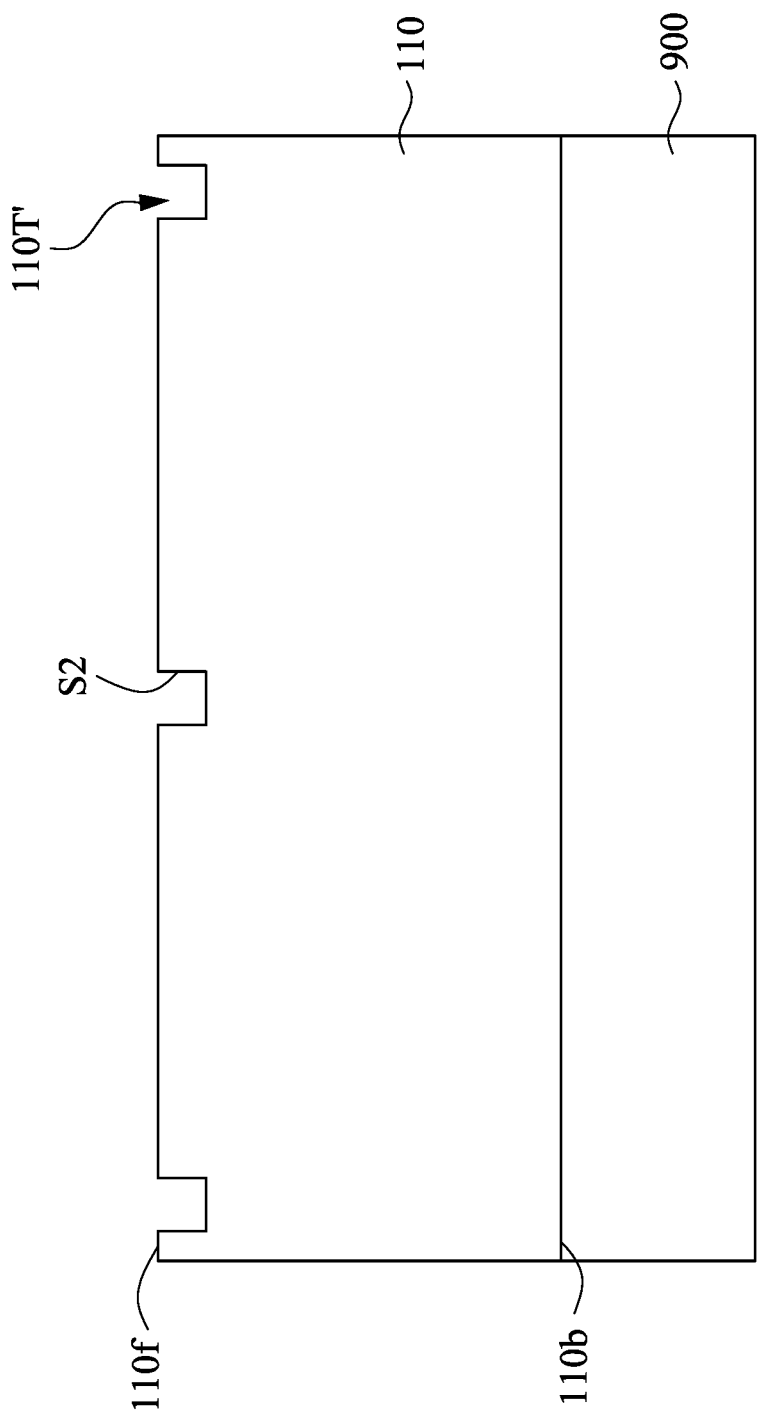

Reference is made to FIG. 15. The metal catalyst layer 320' is removed from the trenches 110T'. For example, the metal catalyst layer 320' may be rinsed and washed away from the silicon substrate 110 by using a suitable solution, which removes the metal catalyst layer 320' while remaining the substrate 110 intact. The detail configuration of removing the metal catalyst layer 320' may be similar to those illustrated with FIG. 9, and not repeated herein.

Figure 16:
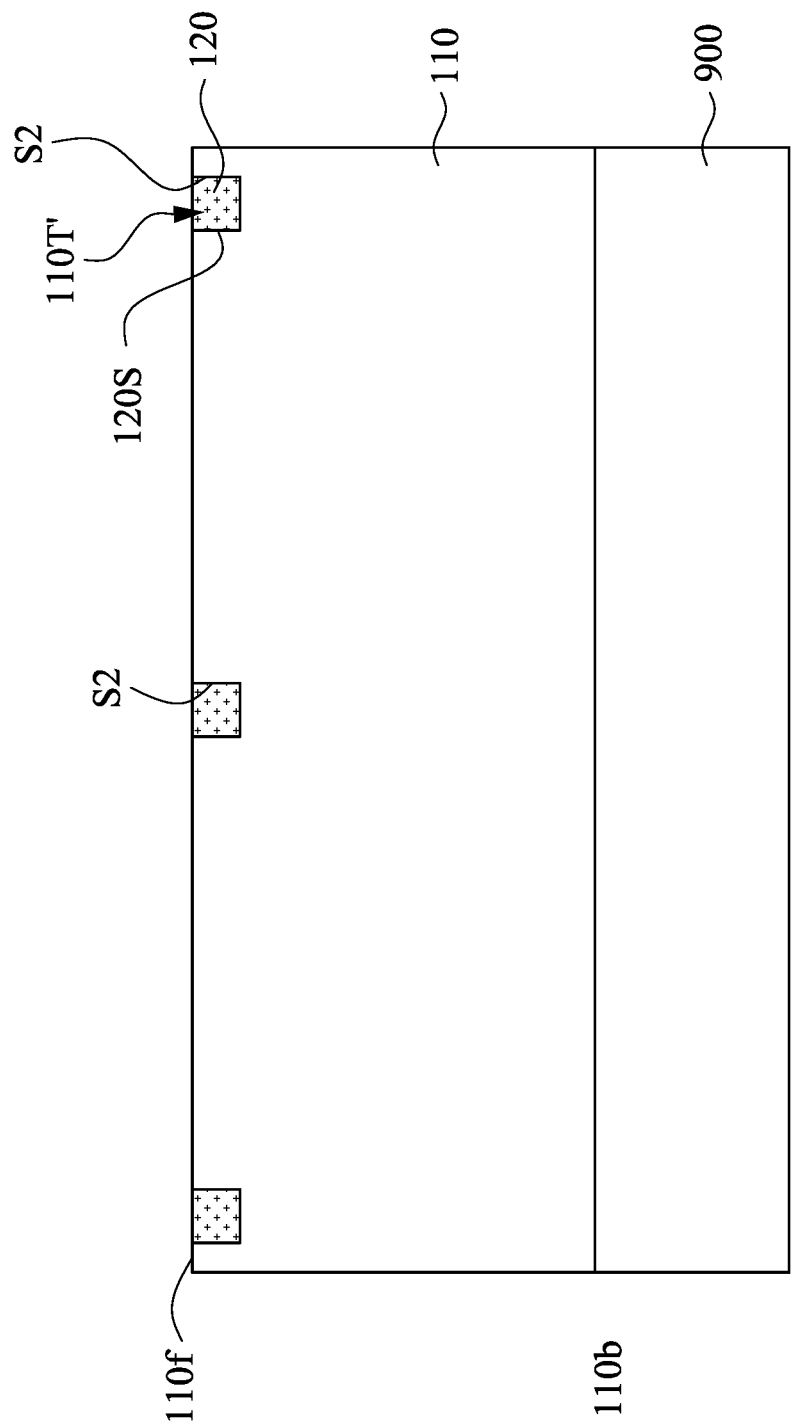

Reference is made to FIG. 16. Isolation features 120 are formed in the trenches 110T'. In some embodiments, the isolation features 120 may be referred to as STI structures. In various embodiments, the isolation features 120 may include an oxide, such as silicon oxide, TEOS, silicon nitride, silicon oxynitride, a low-k material, or other suitable dielectric materials. For example, the trenches 110T' is overfilled with a dielectric material, and then a planarization process such as CMP is performed to remove a portion of the dielectric material out of the trenches 110T'. Any suitable deposition technique, such as chemical vapor deposition (CVD), can be used to form the dielectric material. The isolation features 120 may have vertical sidewalls 120S correspond to the vertical sidewalls S2 of the trenches 110T'. For example, an angle between the vertical sidewalls 120S and the front-side 110f can be in a range of about 80 degrees to about 100 degrees, for example, in a range of about 89 degrees to about 91 degrees.

Figure 17:
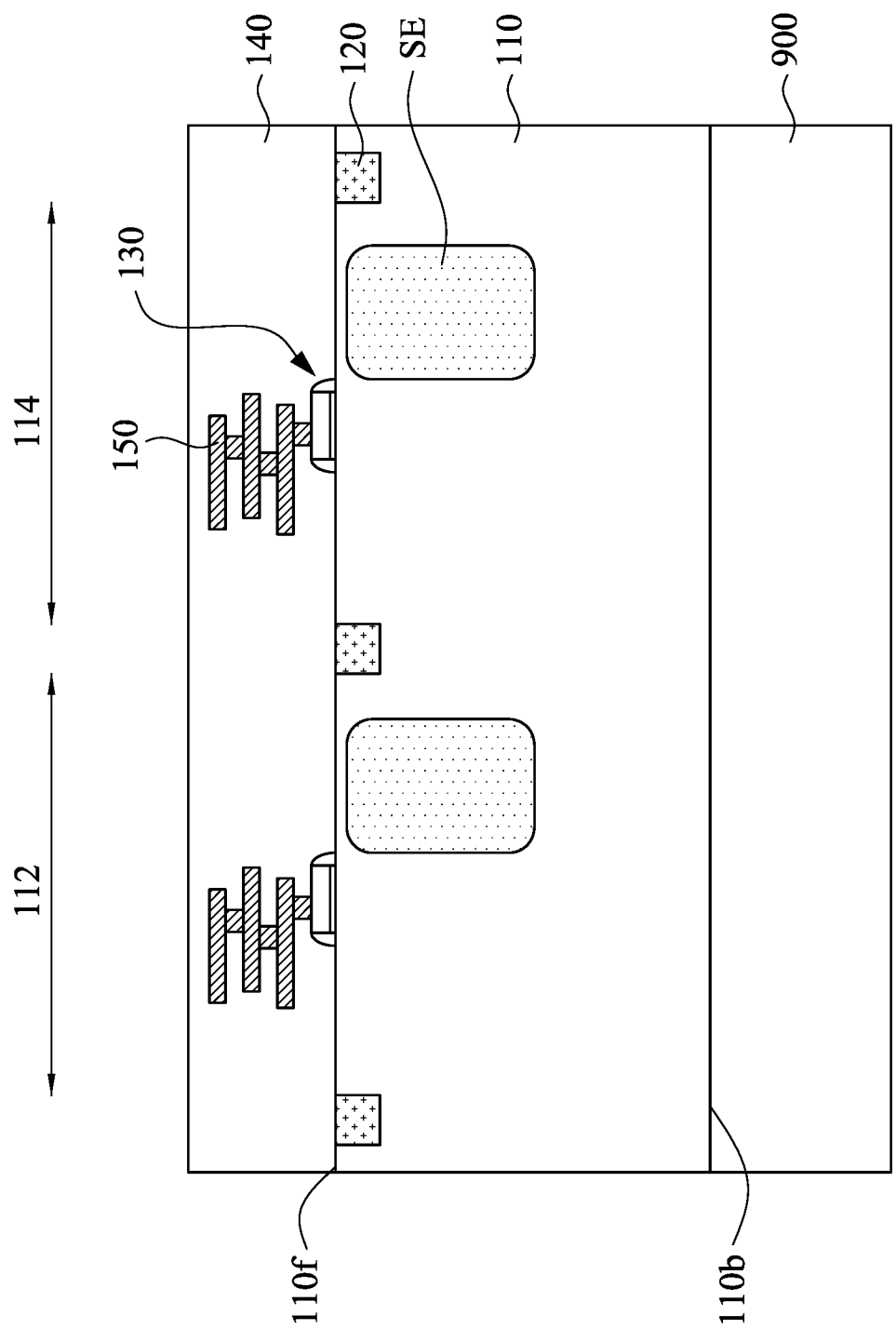

Reference is made to FIG. 17. Plural photosensitive regions SE are formed within pixel regions 112-114 of the substrate 110, respectively, in which each pixel regions 112-114 is between two adjacent isolation features 120. Subsequently, one or more transistor gate structures 130 are formed along the front-side 110f of the substrate 110 within the pixel regions 112-114, and then plural conductive interconnect layers 150 are formed within a dielectric structure 140 formed along the front-side 110f of the substrate 110. The detail configuration of the formation of the transistor gate structures 130, the dielectric structure 140, and the conductive interconnect layers 150 may be similar to those illustrated with FIGS. 3 and 4, and not repeated herein.

Figure 18:
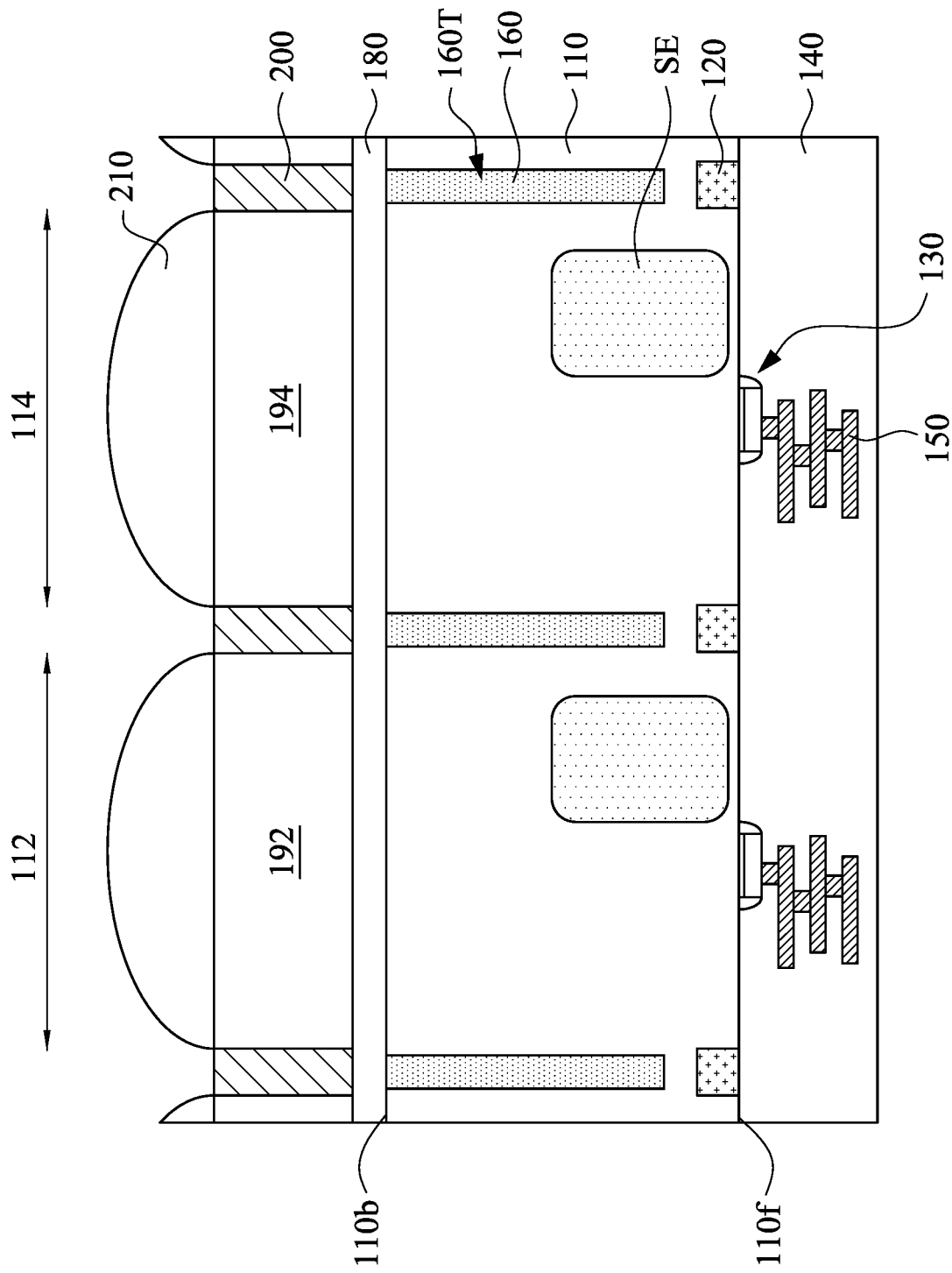

Reference is made to FIG. 18. The substrate 110 is first flipped about the horizontal axis, and the support substrate 900 (referring to FIG. 16) is removed. Subsequently, DTI features 160 are formed on the back-side 110b of the substrate 110. Then, a dielectric planarization structure 180, color filters 192-194, and micro-lenses 210 are formed on the back-side 110b of the substrate 110 in a sequence. Other detail configuration of the DTI features 160, dielectric planarization structure 180, color filters 192-194, and micro-lenses 210 are illustrated previously, and not repeated herein.

Figure 19:
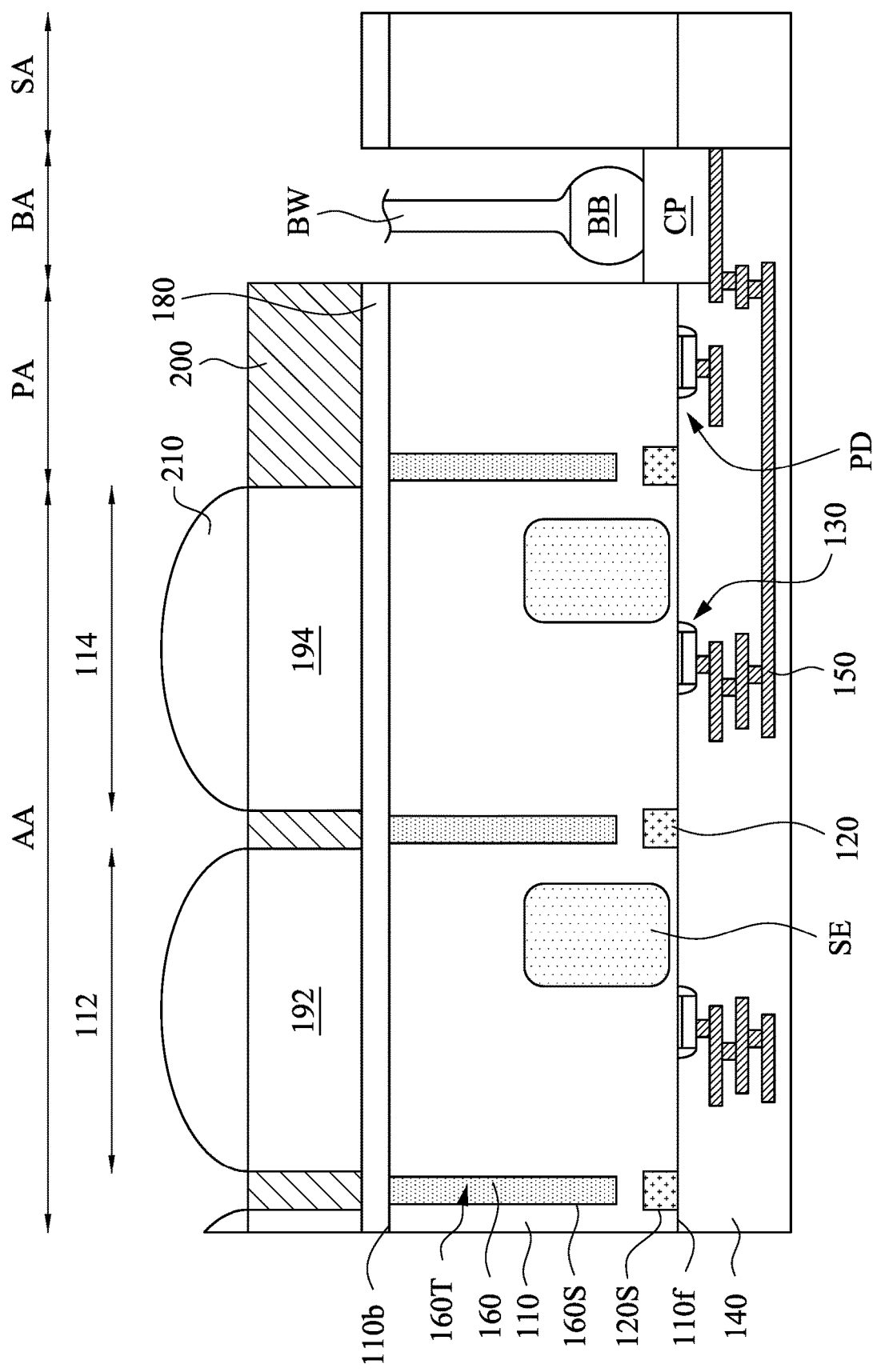
FIG. 19 is a cross-sectional view of an image sensor device according to some embodiments of the present disclosure.

FIG. 19 is a cross-sectional view of an image sensor device 100 according to some embodiments of the present disclosure. The image sensor device 100 include a pixel array area AA, a periphery area PA, a bonding pad area BA (also referred to as an E-pad region), and a scribe line area SA. The dashed lines in FIG. 19 designate the approximate boundaries between the areas AA, PA, BA, and SA. It is understood that these areas AA, PA, BA, and SA extend vertically above and below the substrate 110. The pixel array area AA contains arrays of radiation-sensing pixels. Each pixel may include a radiation-sensing device (e.g., photosensitive regions SE and transistors coupled to the photosensitive regions SE) that can sense or detect radiation having specific wavelengths, which may correspond to lights of different colors. The DTI features 160 or STI features 120 defines the pixel regions 112-114 accommodating the radiation-sensing pixels. The periphery area PA may include other devices PD that need to be kept optically dark. For example, the devices PD may be a digital device, such as an application-specific integrated circuit (ASIC) device or a system-on-chip (SOC) device. The other devices PD may be a reference pixel that is used to establish a baseline of an intensity of light for the image sensor device 100. The bonding pad area BA may include one or more conductive bonding pads or E-pads CP, through which electrical connections between the image sensor device 100 and outside devices may be established. For example, a bonding wire BW is attached to the conductive bonding pad CP through the bonding ball BB. The scribe line area SA may be the region that separates one semiconductor die that includes the bonding pad area BA, the periphery area PA, and the pixel array area AA from an adjacent semiconductor die (not illustrated). The scribe line area SA is cut in a later fabrication process to separate adjacent dies before the dies are packaged and sold as integrated circuit chips. The scribe line area SA is cut in such a way that the semiconductor devices in each die are not damaged.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the wet etching process with metal catalyst forms trenches in a substrate without using plasma, such that lattice of the substrate would not be damaged by the plasma. Another advantage is that the trenches are formed with high aspect ratio, such that the isolation features (e.g., DTI structure) in the substrate may get deeper and applicable to image sensors detecting long wavelength light (e.g. infrared light or far infrared light) or multi-wavelength light. Still another advantage is that the wet etching process with metal catalyst result in the isolation features (e.g., DTI or STI structures) having vertical sidewalls, which in turn will enlarge areas of the pixel regions of the image sensor.

In some embodiments, a method for fabricating a semiconductor device is provided. The method includes forming a metal catalyst layer on an etching area of the semiconductor substrate; performing a wet etch process to the semiconductor substrate to etch the etching area of the semiconductor substrate under the metal catalyst layer, thereby forming a trench in the semiconductor substrate; and removing the metal catalyst layer from the semiconductor substrate after performing the wet etch process.

In some embodiments, a method for fabricating a semiconductor device is provided. The method includes forming a plurality of photosensitive regions in the semiconductor substrate; forming a metal catalyst layer on a back-side of a semiconductor substrate after forming the photosensitive regions; etching a portion of the semiconductor substrate under the metal catalyst layer, thereby forming a trench on the back-side of the semiconductor substrate; and forming an isolation feature in the trench on the back-side of the semiconductor substrate.

In some embodiments, a method for fabricating a semiconductor device is provided. The method includes forming a metal catalyst layer on a front-side of a semiconductor substrate; etching a portion of the semiconductor substrate under the metal catalyst layer, thereby forming a trench on the front-side of the semiconductor substrate; forming an isolation feature in the trench on the front-side of the semiconductor substrate; and forming a plurality of photosensitive regions in the semiconductor substrate after forming the isolation feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    forming a patterned mask layer on a semiconductor substrate, wherein the patterned mask layer exposes an etching area of the semiconductor substrate;
    depositing a metal catalyst material on the etching area and the patterned mask layer;
    removing the patterned mask layer and a portion of the metal catalyst material on the patterned mask layer to form a metal catalyst layer on the etching area of the semiconductor substrate;
    performing a wet etch process to the semiconductor substrate to etch the etching area of the semiconductor substrate under the metal catalyst layer, thereby forming a trench in the semiconductor substrate; and
    removing the metal catalyst layer from the semiconductor substrate after performing the wet etch process.

2. The method of claim 1, wherein performing the wet etch process comprises immersing the semiconductor substrate in an etching solution.

3. The method of claim 1, further comprising:
    forming an interconnect layer on a first side of the semiconductor substrate prior to depositing the metal catalyst material, wherein depositing the metal catalyst material is performed such that the metal catalyst material is on a second side of the semiconductor substrate opposite to the first side of the semiconductor substrate.

4. The method of claim 1, further comprising:
    forming an interconnect layer on a first side of the semiconductor substrate, wherein depositing the metal catalyst material is performed such that the metal catalyst material is on the first side of the semiconductor substrate.

5. The method of claim 1, wherein the wet etch process is performed such that the metal catalyst layer is in the trench, and removing the metal catalyst layer from the semiconductor substrate is performed such that the metal catalyst layer is removed from the trench.

6. The method of claim 1, further comprising:
    forming an isolation feature in the trench after removing the metal catalyst layer from the semiconductor substrate.

7. The method of claim 6, wherein forming the isolation feature in the trench comprises:
    overfilling the trench with a dielectric material; and
    planarizing the dielectric material to remove a portion of the dielectric material outside the trench.

8. A method for fabricating a semiconductor device, comprising:
    forming a plurality of photosensitive regions in a semiconductor substrate;
    forming an interconnect layer on a front-side of the semiconductor substrate after forming the photosensitive regions;
    forming a metal catalyst layer on a back-side of the semiconductor substrate after forming the photosensitive regions and forming the interconnect layer;
    etching a portion of the semiconductor substrate under the metal catalyst layer, thereby forming a trench on the back-side of the semiconductor substrate; and
    forming an isolation feature in the trench on the back-side of the semiconductor substrate.

9. The method of claim 8, wherein forming the photosensitive regions comprises performing an implantation process to the front-side of the semiconductor substrate.

10. The method of claim 8, wherein forming the isolation feature is performed such that the isolation feature is between adjacent two of the photosensitive regions.

11. The method of claim 8, wherein forming the isolation feature is performed such that the isolation feature has a vertical sidewall with respect to the back-side of the semiconductor substrate.

12. The method of claim 8, wherein forming the metal catalyst layer is performed such that the metal catalyst layer has a plurality of openings to expose the back-side of the semiconductor substrate.

13. The method of claim 8, further comprising:
removing the metal catalyst layer from the semiconductor substrate prior to forming the isolation feature.

14. A method for fabricating a semiconductor device, comprising:
forming a patterned mask layer on a front-side of a semiconductor substrate;
depositing a metal catalyst material on the patterned mask layer on the front-side of a semiconductor substrate;
removing the patterned mask layer and a portion of the metal catalyst material on the patterned mask layer to form a metal catalyst layer on the front-side of the semiconductor substrate;
etching a portion of the semiconductor substrate under the metal catalyst layer, thereby forming a trench on the front-side of the semiconductor substrate;
forming an isolation feature in the trench on the front-side of the semiconductor substrate; and
forming a plurality of photosensitive regions in the semiconductor substrate after forming the isolation feature.

15. The method of claim 14, wherein forming the photosensitive regions comprises performing an implantation process to the front-side of the semiconductor substrate.

16. The method of claim 14, wherein forming the photosensitive regions is performed such that the isolation feature is between adjacent two of the photosensitive regions.

17. The method of claim 14, wherein forming the isolation feature is performed such that the isolation feature has a vertical sidewall with respect to the front-side of the semiconductor substrate.

18. The method of claim 14, wherein removing the patterned mask layer and a portion of the metal catalyst material on the patterned mask layer is performed such that the metal catalyst layer has a plurality of openings to expose the front-side of the semiconductor substrate.

19. The method of claim 14, further comprising:
removing the metal catalyst layer from the semiconductor substrate prior to forming the isolation feature.

20. The method of claim 14, further comprising:
forming an interconnect layer on the front-side of the semiconductor substrate after forming the photosensitive regions.

* * * * *